United States Patent
Takagi

(10) Patent No.: US 6,774,364 B2
(45) Date of Patent: Aug. 10, 2004

(54) ELECTRON MICROSCOPE, METHOD FOR OPERATING THE SAME, AND COMPUTER-READABLE MEDIUM

(75) Inventor: Shigenori Takagi, Osaka (JP)

(73) Assignee: Keyence Corporation, Osaka (JP)

( * ) Notice: Subject to any disclaimer, the term of this patent is extended or adjusted under 35 U.S.C. 154(b) by 0 days.

(21) Appl. No.: 10/410,131

(22) Filed: Apr. 10, 2003

(65) Prior Publication Data

US 2003/0193025 A1 Oct. 16, 2003

(30) Foreign Application Priority Data

Apr. 11, 2002 (JP) ................................. P. 2002-108932

(51) Int. Cl.[7] ................................................ H01J 37/28
(52) U.S. Cl. .................. 250/310; 250/311; 250/306; 250/307; 250/397
(58) Field of Search ............................. 250/310, 311, 250/306, 307, 397

(56) References Cited

U.S. PATENT DOCUMENTS 6,531,697 B1 * 3/2003 Nakamura et al. .......... 250/311
6,541,771 B2 * 4/2003 Iwabuchi et al. ........... 250/310

FOREIGN PATENT DOCUMENTS

| JP | 05-062631 | 3/1993 |
|---|---|---|
| JP | 2001-6588 A | 1/2001 |
| JP | 2001-235438 A | 8/2001 |
| JP | 2001-338603 A | 12/2001 |

* cited by examiner

Primary Examiner—Nikita Wells
(74) Attorney, Agent, or Firm—Morgan, Lewis & Bockius LLP

(57) ABSTRACT

In an operation of an electron microscope, at least a spot size of an electron beam on a specimen, an acceleration voltage, a detector type, a specimen position, and an observation magnification are set as a predetermined image observation condition and an observation image is picked up under the predetermined image observation condition. Different image observation conditions are automatically set based on the observation image. A plurality of observation images are picked up based on the setup image observation conditions. The plurality of picked-up observation images are simultaneously displayed on a second display section. A desired observation image is selected from among the observation images displayed on the second display section. The selected observation image is displayed on a first display section on an enlarged scale.

26 Claims, 28 Drawing Sheets

| KEYENCE MS03 | | 41 |
|---|---|---|
| AUTO OBSERVATION | HYDRATED MATERIAL OBSERVATION | MANUAL OBSERVATION |
| ● THIS MODE IS FOR BEGINNERS<br>· YOUR OPERATION IS GUIDED FROM MATERIAL SETTING TO IMAGE OUTPUT<br>· YOU CAN OBTAIN DESIRED IMAGE WITHOUT SPECIAL KNOWLEDGE REGARDING ELECTRO MICROSCOPE | ● THIS MODE IS FOR OBSERVATION OF CREATURES<br>· YOU CAN USE THIS MODE ONLY FOR A DEVICE INCLUDING WET FUNCTION<br>· THE EVAPORATION OF WATER, OIL, ETC. CAN BE RELATIVELY REDUCED | ● THIS MODE IS FOR MAXIMISING PERFORMANCE OF MS03<br>· YOU CAN OPERATE ALL PARAMETERS REGARDING SETTING AND ADJUSTMENT OF MS03<br>· PARAMETERS ARE ALMOST SAME AS THOSE OF USUAL SCANNING ELECTRO MICROSCOPE |
| ALBUM | MEASUREMENT | OPTION / MAINTENANCE |
| ● THIS MODE IS FOR ARRANGEMENT OF OBTAINED IMAGES<br>· YOU CAN PERFORM FILE ARRANGEMENT, CHANGE OF NAME, RESEARCH, ETC. FOR RETAINED IMAGES<br>· IMAGES PICKED-UP AT OBSERVATION ARE RETAINED IN "AUTOMATIC RETENTION" FOLDER | ● THIS MODE IS FOR MEASUREMENT OF DISTANCE OR AREA<br>· YOU CAN USE THIS MODE ONLY FOR A DEVISE INSTALLED WITH OPTIONAL MEASUREMENT SOFTWARE<br>· MEASUREMENT IS PERFORMED FOR IMAGES PICKED UP AT OBSERVATION OR IMAGES CALLED FROM ALBUM | ● THIS MODE IS FOR INITIAL SETTING<br><br>● THIS MODE IS FOR EXCHANGE OF CONSUMABLE PART<br>· YOU CAN USE THIS MODE FOR EXCHANGE OF FILAMENT, OBJECTIVE STOP (ORIFICE) AND SLEEVE |

40

END

ELECTRON MICROSCOPE, METHOD FOR OPERATING THE SAME, AND COMPUTER-READABLE MEDIUM

BACKGROUND OF THE INVENTION

1. Field of the Invention

This invention relates to an electron microscope such as a scanning electron microscope, a transmission electron microscope, etc., a method for operating the electron microscope, and a computer-readable medium.

2. Description of the Related Art

Nowadays, an electron microscope using an electron lens as well as an optical microscope using an optical lens and a digital microscope is used as an enlargement observation apparatus for enlarging a microbody. The electron microscope is provided by electronically optically designing an image formation system such as an optical microscope as the travel direction of electrons is refracted freely. The available electron microscopes include a transmission electron microscope, a reflection electron microscope, a scanning electron microscope, a surface emission electron microscope (field-ion microscope), and the like. The transmission electron microscope uses an electron lens to form an image of electrons passing through, a specimen, a sample, etc. The reflection electron microscope forms an image of electrons reflected on the surface of a specimen. The scanning electron microscope scans a convergent electron beam over the surface of a specimen and uses secondary electrons from the scanning points to form an image. The surface emission electron microscope (field-ion microscope) forms an image of electrons emitted from a specimen by heating or ion application.

The scanning electron microscope (SEM) is an apparatus for using a secondary electron detector, a reflection electron detector, etc., to take out secondary electrons, reflection electrons, etc., occurring upon application of a thin electron beam (electron probe) to an objective specimen and displaying an image on a display screen of a CRT, LCD, etc., for the operator mainly to observe the surface form of the specimen. On the other hand, the transmission electron microscope (TEM) is an apparatus for allowing an electron beam to pass through a thin-film specimen and providing electrons scattered and diffracted by atoms in the specimen at the time as an electron diffraction pattern or a transmission electron-microscopic image, thereby enabling the operator mainly to observe the internal structure of a substance.

When an electron beam is applied to a solid specimen, it passes through the solid by energy of the electrons. At the time, an elastic collision, elastic scattering, and inelastic scattering involving an energy loss are caused by the interaction between the nucleuses and the electrons making up the specimen. As inelastic scattering occurs, the intra-shell electrons of the specimen elements and X-rays, etc., are excited, and secondary electrons are emitted, the energy corresponding thereto is lost. The emission amount of the secondary electrons varies depending on the collision angle. On the other hand, reflection electrons scattered backward by elastic scattering and emitted again from the specimen are emitted in the amount peculiar to the atom number. The scanning electron microscope uses the secondary electrons and the reflection electrons. The scanning electron microscope applies electrons to a specimen and detects the emitted secondary electrons and reflection electrons for forming an observation image.

However, the electron microscope such as SEM or TEM involves a problem of difficult operation as compared with enlargement observation apparatus such as an optical microscope and a digital microscope. Particularly, it takes time until an observation image is actually provided in addition to a large number of setup items of image observation conditions to pick up an observation image. Thus, what observation image screen is provided in response to the specified image observation condition cannot be checked in real time, and it is difficult to understand how one setup condition is reflected on the observation image screen. Particularly, a beginner unfamiliar with operation of an electron microscope cannot forecast how which item of the observation conditions will affect an image, and thus will search for an observation image by trial and error while changing the image observation conditions in various manners. Thus, it is hard for the beginner to operate an electron microscope and often an expert operator operates an electron microscope.

The expert operator can forecast the general effect of each item of the observation conditions on an observation image to some extent. However, in actual image observation, the effect changes depending on the condition and thus in the end, it becomes necessary to actually obtain an observation image and check the image and a search is made for the optimum condition by trial and error. Therefore, the expert operator also has a desire to use an easily operable electron microscope for enabling the operator to easily check how an observation image changes under various image observation conditions.

SUMMARY OF THE INVENTION

It is therefore an object of the invention to provide an electron microscope provided with a guidance function to facilitate setting the electron microscope, a method for operating n electron microscope, and a computer-readable medium.

In order to accomplish the object above, the following means are adopted. According to a first aspect of the present invention, there is provided an electron microscope for picking up an observation image of a specimen based on an image observation condition, the electron microscope comprising:

an image observation condition setting section for setting a plurality of different image observation conditions for a predetermined observation image picked up under a predetermined image observation condition;

an observation image acquisition section for picking up a plurality of observation images based on the plurality of image observation conditions set through the image observation condition setting section;

a second display section for simultaneously displaying the plurality of observation images picked up by the observation image acquisition section;

an observation image selection section for selecting a desired observation image from among the observation images displayed on the second display section; and a first display section for displaying on an enlarged scale the observation image selected through the observation image selection section.

The electron microscope according to a second aspect of the present invention is characterized by the fact that the image observation condition setting section automatically sets a plurality of acceleration voltage conditions with at least an acceleration voltage changed as the different image observation conditions in addition to the characteristic according to the first aspect of the present invention.

The electron microscope according to a third aspect of the present invention is characterized by the fact that the image observation condition setting section automatically makes a detector selection as the different image observation conditions in addition to the characteristic according to the first aspect of the present invention.

The electron microscope according to a fourth aspect of the present invention is characterized by the fact that the observation images displayed on the second display section include a plurality of secondary electron images in addition to the characteristic according to the first aspect of the present invention.

The electron microscope according to a fifth aspect of the present invention is characterized by the fact that the observation images displayed on the second display section include a plurality of reflection electron images in addition to the characteristic according to the first aspect of the present invention.

The electron microscope according to a sixth aspect of the present invention is characterized by the fact the observation images displayed on the second display section include at least one secondary electron image and at least one reflection electron image in addition to the characteristic according to the first aspect of the present invention.

Further, the observation images displayed on the second display section may be made up of a plurality of secondary electron images and at least one reflection electron image.

The electron microscope according to a seventh aspect of the present invention is characterized by the fact that the observation image acquisition section picks up the observation images in the ascending order of the acceleration voltages in addition to the characteristic according to the second aspect of the present invention.

The electron microscope according to a eighth aspect of the present invention is characterized by the fact that the observation images acquisition section picks up the observation images in the order as each secondary electron image is picked up and then each reflection electron image is picked up in addition to the characteristic according to the sixth aspect of the present invention.

The electron microscope according to a ninth aspect of the present invention is characterized by the fact that it further comprises an adjustment section for adjusting the observation image selected through the observation image selection section with respect to at least any of focus, brightness, or contrast in addition to the characteristic according to the first aspect of the present invention.

The electron microscope according to a tenth aspect of the present invention is characterized by the fact that it further comprises a retention section for retaining the image observation conditions corresponding to the observation images displayed on the second display section in addition to the characteristic according to the first aspect of the present invention.

The electron microscope according to a eleventh aspect of the present invention is characterized by the fact that the image observation condition setting section calls the retained image observation conditions from the retention section to set the different image observation conditions, and the image observation acquisition section picks up a plurality of observation images based on the called image observation conditions in addition to the characteristic according to the tenth aspect of the present invention.

The electron microscope according to a twelfth aspect of the present invention is characterized by the fact that the image observation condition setting section sets a plurality of new image observation conditions based on the image observation condition of the observation image selected by the observation image selection section, and the image observation acquisition section picks up a plurality of observation images based on the setup new image observation conditions in addition to the characteristic according to the first aspect of the present invention.

For example, a plurality of new image observation conditions are set with the acceleration voltage changed based on the acceleration voltage of the selected observation image with the value as the center.

Further, in order to accomplish the object above, according to a thirteenth aspect of the present invention, there is provided a method for operating an electron microscope which picks up an observation image of a specimen based on an image observation condition, the method comprising:

setting a plurality of different image observation conditions for a predetermined observation image picked up under a predetermined image observation condition;

picking up a plurality of observation images based on the setup image observation conditions;

simultaneously displaying the plurality of picked-up observation images on a second display section;

selecting a desired observation image from among the observation images displayed on the second display section; and displaying the selected observation image on a first display section on an enlarged scale.

The electron microscope operation method according to a fourteenth aspect of the present invention is characterized by the fact that it further comprises manually setting at least a spot size of an electron beam on the specimen, an acceleration voltage, a detector type, a specimen position, and an observation magnification as the predetermined image observation condition, and picking up an observation image based on the setup image observation condition as the predetermined observation image, wherein the plurality of different image observation conditions are automatically set based on the predetermined observation image in addition to the characteristic according to the thirteenth aspect of the present invention.

According to a fifteenth aspect of the present invention, there is provided a method for operating an electron microscope which picks up an observation image of a specimen based on an image observation condition, the method comprising:

setting a plurality of different image observation conditions for a predetermined observation image picked up under a predetermined image observation condition;

simply picking up a plurality of observation images based on the setup image observation conditions;

simultaneously displaying the plurality of picked-up simple observation images on a second display section;

selecting a desired simple observation image from among the simple observation images displayed on the second display section; and performing an usual image picking-up based on the image observation condition corresponding to the selected simple observation image.

The simple image picking up is as follows: To acquire an observation image under the optimum image observation condition, one or more preliminary image observation conditions are set before usual image picking up is performed, and one or more simple observation images are picked up based on the one or more image observation conditions.

According to a sixteenth aspect of the present invention, there is provided a method for operating an electron microscope which picks up an observation image of a specimen based on an image observation condition, the method comprising:

specifying at least characteristics of a specimen as setup items of a predetermined image observation condition;

setting the predetermined image observation condition based on the specified characteristics of the specimen;

simply picking up an observation image under the predetermined image observation condition and displaying the picked-up simple observation image on a first display section, setting one or more simple image observation conditions with at least an acceleration voltage or a detector changed for the simple observation image displayed on the first display section displaying one or more simple observation images simply picked up based on the one or more simple image observation conditions on a second display section;

selecting a desired simple observation image from among the one or more simple observation images displayed on the second display section; and performing a usual image picking-up based on the simple image observation condition corresponding to the selected simple observation image and displaying the picked-up image on the first display section.

The electron microscope operation method according to a seventeenth aspect of the present invention is characterized by the fact that it further comprises making at least magnification adjustment and position adjustment to the simple observation image displayed on the first display section, before setting the one or more simple image observation conditions, wherein the one or more simple image observation conditions are set for the simple observation image adjusted in at least magnification and position in addition to the characteristic according to the sixteenth aspect of the present invention. Alternatively, it may further comprises making at least magnification adjustment and position adjustment to the selected simple observation image, before performing the usual image picking-up, wherein the usual image picking-up is performed based on the simple image observation condition corresponding to the selected simple observation image at adjusted magnification and position.

According to a eighteenth aspect of the present invention, there is provided a method for operating an electron microscope which picks up an observation image of a specimen based on an image observation condition, the method comprising:

manually setting at least a spot size of an electron beam on the specimen, an acceleration voltage, a detector type, a specimen position, and an observation magnification as setup items of a predetermined image observation condition;

picking up an observation image under the predetermined image observation condition and displaying the picked-up observation image on a first display section;

making at least magnification adjustment and position adjustment to the observation image displayed on the first display section;

setting one or more simple image observation conditions with at least the acceleration voltage or the detector changed for the observation image displayed on the first display section and adjusted in at least magnification and position;

displaying one or more simple observation images simply picked up based on the one or more simple image observation conditions on a second display section;

selecting a desired simple observation image from among the one or more simple observation images displayed on the second display section; and performing an usual image picking-up based on the simple image observation condition corresponding to the selected simple observation-image and displaying the picked-up image on the first display section.

The electron microscope operation method according to a nineteenth aspect of the present intervention is characterized by the fact that it further comprises setting one or more simple image observation conditions with at least the acceleration voltage or the detector changed as new image observation condition for the selected simple observation image after selecting any desired simple observation image from among the one or more simple observation images displayed on the second display section; displaying one or more simple observation images simply picked up based on the one or more simple image observation conditions on the second display section; selecting a desired simple observation image from among the one or more simple observation images displayed on the second display section; and displaying the selected simple observation image on the first display section in addition to the characteristic according to any of the fifteenth, sixteenth and eighteenth aspects of the present invention.

The electron microscope operation method according to a twentieth aspect of the present invention is characterized by the fact that the image observation conditions are preset image observation conditions in addition to the characteristic according to any of the fifteenth, sixteenth and eighteenth aspects of the present invention.

The electron microscope operation method according to a twenty-first aspect of the present invention is characterized by the fact that it further comprises printing data of the picked-up observation image; and retaining the data of the observation image in addition to the characteristic according to any of the thirteenth, fifteenth, sixteenth and eighteenth aspects of the present invention.

The electron microscope operation method according to a twenty-second aspect of the present invention is characterized by the fact that it further comprises the steps of setting one or more simple image observation conditions with at least the acceleration voltage or the detector changed as new image observation condition for the selected observation image; displaying one or more simple observation images simply picked up based on the one or more simple image observation conditions on the second display section; selecting any desired simple observation image from among the one or more simple observation images displayed on the second display section; and displaying the selected simple observation image on the first display section before the printing step in addition to the characteristic according to the twenty-first aspect of the present invention.

The electron microscope operation method according to a twenty-third aspect of the present invention is characterized by the fact that the simple observation images displayed on the second display section include one or more secondary electron images or one or more reflection electron images in addition to the characteristic according to any of the thirteenth, fifteenth, sixteenth and eighteenth aspects of the present invention.

The electron microscope operation method according to a twenty-fourth aspect of the present invention is characterized by the fact that it further comprises the step of retaining a history of the image observation conditions, wherein the history is called as required and any desired image observation condition is selected out of the history, whereby image picking up or simple image picking up can be performed under the same image observation condition as the selected image observation condition in addition to the characteristic according to any of thirteenth, fifteenth, sixteenth and eighteenth aspects of the present invention.

The electron microscope operation method according to a twenty-fifth aspect of the present invention is characterized by the fact that it further comprises the step of retaining an image observation condition as required, wherein the retained image observation condition is called as required and image picking up or simple image picking up can be performed under the same image observation condition as the retained image observation condition in addition to the characteristic according to any of the thirteenth, fifteenth, sixteenth and eighteenth aspects of the present invention.

The electron microscope operation method according to a twenty-sixth aspect of the present invention is characterized by the fact that a plurality of image observation conditions are selected from among the retained image observation conditions and based on the selected image observation conditions, a plurality of observation images are simply picked up and can be displayed on the second display section in addition to the characteristic according to the twenty-fourth or twenty-fifth aspect of the present invention.

According to a twenty-seventh aspect of the present invention, there is provided a computer-readable medium including a program executable on a computer for operating an electron microscope which picks up an observation image of a specimen based on an image observation condition, the program comprising instructions having:

a first function of automatically setting a plurality of acceleration voltage conditions with at least an acceleration voltage changed and making a detector selection as different image observation conditions for an observation image picked up under a predetermined image observation condition;

a second function of simply picking up a plurality of observation images in the ascending order of acceleration voltages based on the image observation conditions set through the first function;

a third function of simultaneously displaying on a reduced scale the plurality of simple observation images including at least one secondary electron image and at least one reflection electron image simply picked up through the second function on a second display section;

a fourth function of selecting a desired simple observation image from among the simple observation images displayed on the second display section;

a fifth function of displaying on an enlarged scale the simple observation image selected through the third function on a first display section;

a sixth function of adjusting the observation image displayed on the first display section with respect to at least any of focus, brightness, or contrast;

a seventh function of performing an usual image picking-up based on the image observation condition corresponding to the simple observation image selected and adjusted as required; and an eight function of retaining a desired image observation condition corresponding to the usually picked-up observation image though the seventh function.

The medium includes a magnetic disk, an optical disk, a magneto-optical disk, semiconductor memory, or any other medium capable of storing a program, such as CD-ROM, CD-R, CD-RW, flexible disk, magnetic tape, MO, DVD-ROM, DVD-RAM, DVD-R, DVD-RW, OR DVD+RW.

BRIEF DESCRIPTION OF THE DRAWINGS

FIG. 2 is an image drawing to show a menu screen of a scanning electron microscope operation program according to one embodiment of the invention;

DETAILED DESCRIPTION OF THE INVENTION

Figure 1:
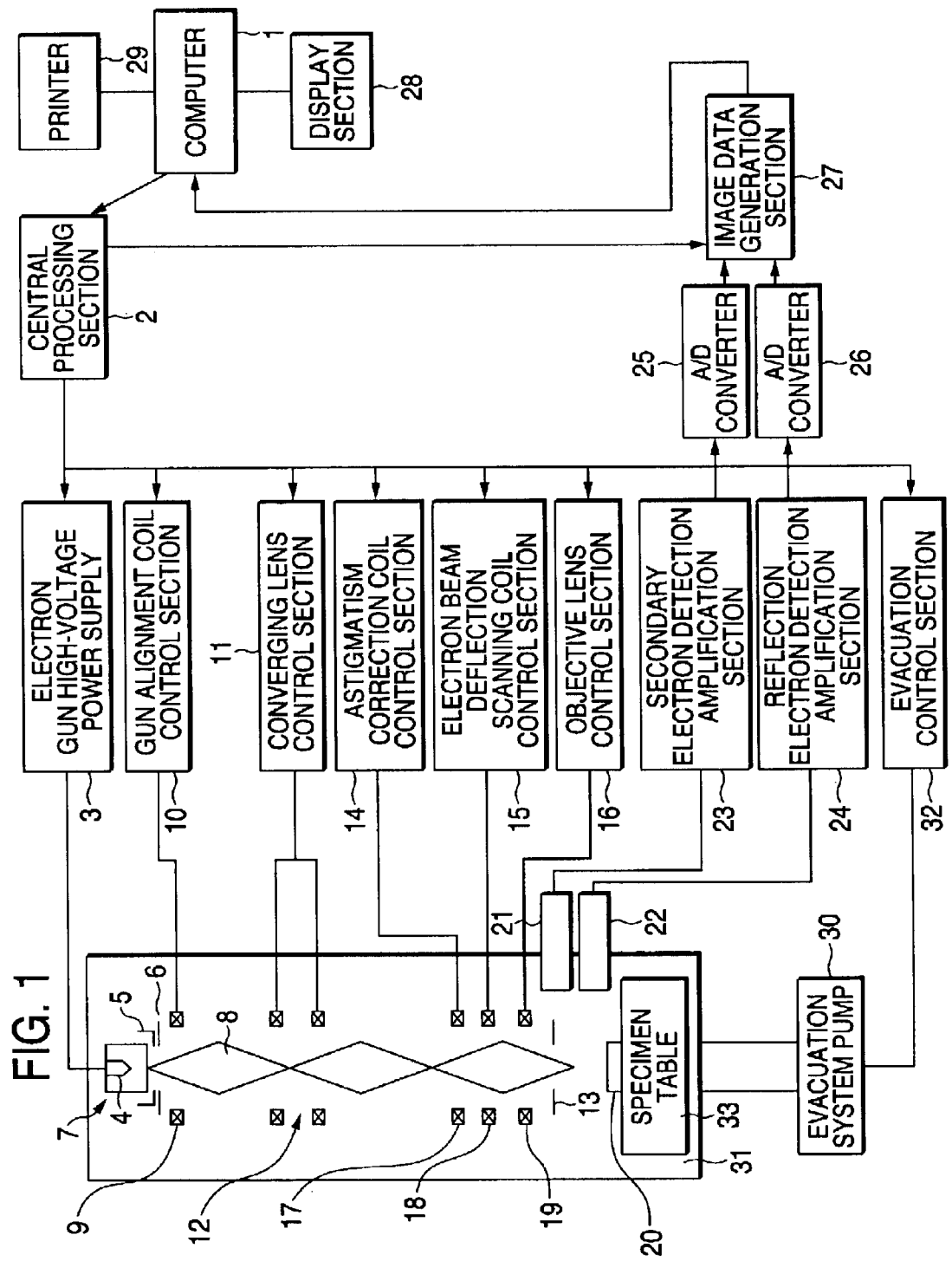
FIG. 1 is a block diagram to show the configuration of a scanning electron microscope according to one embodiment of the invention.
Figure 3:
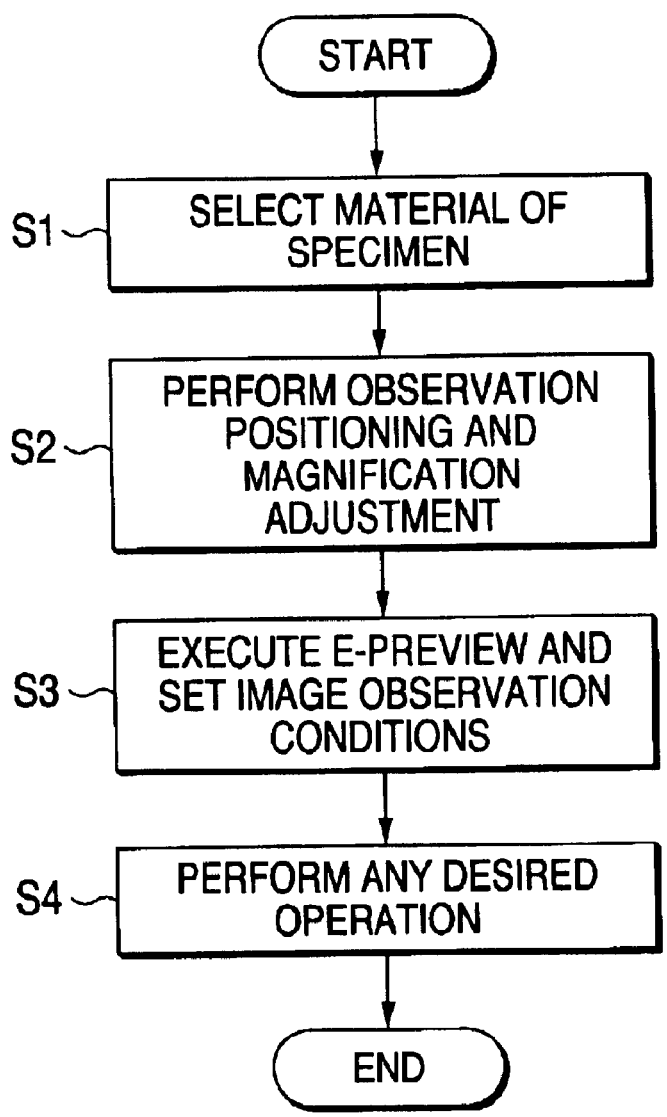
FIG. 3 is a flowchart to show steps of image observation according to an auto observation mode of an electron microscope operation method according to one embodiment of the invention.

Referring now to the accompanying drawings, there is shown a preferred embodiment of the invention. However, it is to be understood that the following embodiment is illustrative for an electron microscope, an electron microscope operation method, an electron microscope operation program, and a computer-readable medium to embody the technical philosophy of the invention and that the invention does not limit the electron microscope, the electron microscope operation method, the electron microscope operation program, and the computer-readable medium to the following.

It is also to be understood that the specification does not limit the members defined in the appended claims to the members in the embodiment. The sizes of members shown in the accompanying drawings, their positional relationship, and the like may be exaggerated to clarify the description.

In the specification, an electron microscope, a computer, and other peripheral machines of a printer, etc., are electrically connected, for example, as serial connection or parallel connection of IEEE1394, RS-232C, RS-422, USB, etc., or through a network of 10BASE-T, 100BASE-TX, etc., for conducting communications. The connection is not limited to physical connection using wires and may be wireless connection using radio waves, infrared rays, optical communications, etc., such as wireless LAN, Bluetooth, etc. Further, a memory card, a magnetic disk, an optical disk, a magneto-optical disk, semiconductor memory, etc., can be used as a record medium for storing data of observation images, etc.

In the embodiment, an example wherein an electron microscope operation program is installed in a computer 1 in FIG. 1 for use will be discussed. As image data, an analog signal is converted into a digital signal, which is then processed. As for the image data of a digital signal, degradation of the image does not occur and image change, image integration, pseudo-coloring, and the like are easy to perform. However, the analog signal need not necessarily be converted into a digital signal, and an image of an analog signal can also be handled.

"Computer" mentioned in the specification is not limited to the computer to which an electron microscope is connected. For example, an electron microscope operation program of the invention can also be used in the form wherein for the operator to learn an operation method of the electron microscope, the electron microscope operation program is installed in a computer not connected to the electron microscope for operation. The computer includes not only a general-purpose or special-purpose computer, workstation, terminal, or any other electronic device in which the electron microscope operation program is installed, but also hardware such as a dedicated apparatus in which an electron microscope operation function is built or an electron microscope itself. The program includes every form for providing a specific function as software of a plug-in, an object, a library, an applet, a compiler, etc.

The following operation is performed through a mouse, a trackball, a track point, a lightpen, a digitizer, or any other input means connected to a computer or electron microscope. Various operation buttons and controls installed on a console of an electron microscope can also be used to operate and set the electron microscope.

The phrase "pressing a button" in the specification is used to mean that if the button is formed virtually on the monitor screen of a computer, the operator clicks on the button with an input device such as a mouse, thereby pressing the button in a pseudo manner. However, not only the method, but also various mechanisms can be used in response to the operation screen. For example, if the operator console is formed on a touch screen or a touch panel, the operator can directly touch the operation console for operation. Alternatively, the operator can also use a lightpen, etc., to specify operation or if the operator console is implemented as a physical operator control panel, the operator operates it physically.

In the following embodiment, a SEM will be discussed. However, the invention can also be used with a TEM or any other electron microscope relevant apparatus. The SEM according to one embodiment of the invention will be discussed with reference to FIG. 1. The SEM generally is made up of an optical system for generating an electron beam of acceleration electrons and making the electron beam arrive at a specimen, a specimen chamber in which a specimen is placed, an evacuation system for evacuating the specimen chamber, and an operation system for observing an image.

The optical system comprises an electron gun 7 for generating an electron beam of acceleration electrons, a lens system for narrowing down a bundle of acceleration electrons to a narrower bundle, and detectors for detecting secondary electrons and reflection electrons generated from a specimen. The scanning electron microscope shown in FIG. 1 has an optical system comprising an electron gun 7, a gun alignment coil 9, condenser lenses of converging lenses 12, an electron beam deflection scanning coil 18, a secondary electron detector 21, and a reflection electron detector 22. The electron gun 7 applies an electron beam. The gun alignment coil 9 makes a correction to the electron beam applied from the electron gun 7 so that the electron beam passes through the center of a lens system. The condenser lenses of converging lenses 12 narrows down the size of the spot of the electron beam. The electron beam deflection scanning coil 18 scans the electron beam converged through the converging lenses 12 over a specimen 20. The secondary electron detector 21 detects secondary electrons emitted from the specimen 20 with scanning. The reflection electron detector 22 detects reflection electrons.

The specimen chamber comprises a specimen table, a specimen introduction unit, an X-ray detection spectroscope, etc. The specimen table comprises X, Y, Z move, rotation, and tilt functions.

The evacuation system is required for the electron beam of acceleration electrons to arrive at the specimen without losing energy as much as possible while the electron beam passes through the gas component; it mainly uses a rotary pump, an oil diffusion pump.

The operation system adjusts, focuses, etc., an application current while displaying a secondary electron image, a reflection electron image, an X-ray image, etc., for observation. Output of a secondary electron image, etc., is typically film photographing with a camera if the signal is analog; in recent years, however, it has been made possible to convert an image into a digital signal for output, and various types of processing such as data storage, image processing, and print are possible. The SEM in FIG. 1 comprises a display section 28 for displaying an observation image of a secondary electron image, a reflection electron image, etc., and a printer 29 for printing the image. The operation system comprises guide means for guiding the operator through a setting procedure of a setup item required for setting at least acceleration voltage or spot size as an image observation condition.

The SEM shown in FIG. 1 is connected to a computer 1 for use as a console for operating the electron microscope; the computer 1 also stores image observation conditions and image data and performs image processing and operations as required. A central processing section 2 made up of a CPU, LSI, etc., shown in FIG. 1 controls the blocks making up the electron microscope. An electron gun high-voltage power supply 3 is controlled, whereby an electron beam is generated from the electron gun 7 consisting of a filament 4, Wehnelt 5, and an anode 6. An electron beam 8 generated from the electron gun 7 does not necessarily pass through the center of the lens system and a gun alignment coil control section 10 controls the gun alignment coil 9 for making a correction to the electron beam so that the electron beam passes through the center of the lens system. Next, the electron beam 8 is narrowed down through the condenser lenses of the converging lenses 12 controlled by a converging lens control section 11. The converged electron beam 8 passes through an astigmatism correction coil 17 for deflecting the electron beam 8, the electron beam deflection scanning coil 18, an objective lens 19, and objective lens stop 13 for determining the beam aperture angle of the electron beam 8, and arrives at the specimen 20. The astigmatism correction coil 17 is controlled by an astigmatism correction coil control section 14, and controls scanning speed, etc. Likewise, the electron beam deflection scanning coil 18 is controlled by the electron beam deflection scanning coil control section 15, and the objective lens 19 is controlled by an objective lens control section 16, whereby the electron beam 8 scans over the specimen 20. As the electron beam 8 scans over the specimen 20, information signals of secondary electrons, reflection electrons, etc., are generated from the specimen 20, and are detected by the secondary electron detector 21 and the reflection electron detector 22. The detected secondary electron information signal and the detected reflection electron information signal are passed through a secondary electron detection amplification section 23 and a reflection electron detection amplification section 24 and are converted into digital signals by A/D converters 25 and 26 respectively. The digital signals are sent to an image data generation section 27 for providing image data. The image data is sent to the computer 1 and is displayed on the display section 28 such as a monitor connected to the computer 1 and is printed on the printer 29 as required.

An evacuation system pump 30 evacuates a specimen chamber 31. An evacuation control section 32 connected to the evacuation system pump 30 adjusts the vacuum degree for controlling the vacuum degree from high vacuum to low vacuum in response to the specimen 20 and the observation purpose.

The electron gun 7 is a section as a source for generating an acceleration electron having one energy; in addition to a heat electron gun for heating a W (tungsten) filament or an $LaB_6$ filament to emit electrons, a field emission electron gun for applying a strong electric field to the tip of W formed like a point for emitting electrons is available. Converting lens, objective lens, objective lens stop, electron beam deflection scanning coil, astigmatism correction coil, and the like are placed in the lens system. The converging lens further converges the electron beam generated by the electron gun and thins down the electron beam. The objective lens is a lens for finally focusing an electron probe on a specimen. The objective lens stop is used to lessen aberration. The detectors are a secondary electron detector for detecting secondary electrons and a reflection electron detector for detecting reflection electrons. The secondary electron has low energy and thus is captured by a collector and is converted into a photoelectron by a scintillator and the signal is amplified by a photo multiplier tube. On the other hand, to detect a reflection electron, a scintillator or a semiconductor type is used.

[Specimen Table]

To position the observation position, a specimen table 33 on which a specimen 20 is placed is moved physically. In this case, observation positioning means is implemented as the specimen table 33. The specimen table 33 can be moved and adjusted in various directions so that the observation position of the specimen 20 can be, adjusted. To move and adjust the observation position of the specimen table, the specimen table can be moved and finely adjusted in an X axis direction, a Y axis direction, and an R axis direction of the specimen table. In addition, to adjust the tilt angle of the specimen, the specimen table can be adjusted in a T axis direction of the specimen table and to adjust the distance between the objective lens and the specimen (working distance), the specimen table can be adjusted in a Z axis direction of the specimen table.

The specimen conditions affecting an observation image of the SEM include the presence or absence of electric conductivity, the presence or absence of metal evaporation deposited on the specimen for the purpose of providing conduction, etc., the presence or absence of a volatile component of moisture, etc., the presence or absence of asperities on the surface, fineness of the asperities, whether the substance forming the specimen is a pure substance or a mixture, the element numbers of the constituent elements, and the like. What image results are determined in a predetermined image observation condition according to the specimen conditions. However, in actual measurement, it is difficult to grasp all the specimen conditions. In addition to the specimen conditions, the operator of the electron microscope determines the image observation condition of the SEM in response to the observation purpose. The observation purpose is to observe what feature of the specimen; for example, the possible purpose is to observe the asperities of the specimen, to observe the specimen composition difference, to observe the surface of the specimen, to observe the specimen ignoring the oil content, etc., deposited on the surface of the specimen, to observe the specimen in what magnification, to observe the specimen placing importance on the resolution or the S/N ratio, to observe the specimen with the specimen simply enlarged, or the like.

Considering the specimen characteristics and the observation purpose, the suited image observation condition is set. The image observation condition of the SEM includes acceleration voltage, the detector type, the vacuum degree, magnification, spot size, specimen observation position (XYR axis position of specimen table), specimen tilt angle (T axis position of specimen table), the working distance between the specimen and the objective lens (Z axis position of specimen table), the objective lens stop diameter, and the like. In addition, deformation caused by specimen damage or evaporation, contamination of the specimen, or the like is also considered.

As for such an image observation condition, the operator of the electron microscope sets items in response to the characteristics and the observation purpose of the specimen to be observed. The manual setting procedure of the image observation condition generally is as follows:

First, one image observation condition expected to be the best as a temporary image observation condition is determined and the SEM is set. For the provided observation image, the adjustment items of magnification, positioning, focus, etc., are adjusted for providing the optimum image under the image observation condition. An observation image is thus acquired relative to one image observation condition. Whether or not the observation image is the optimum is not yet determined and thus it is necessary to search for the optimum image observation condition by trial and error while comparing the observation image with the observation image acquired under any other image observation condition. First, the image data is temporarily retained, printed, or stored so that the provided observation image can be later compared with any other observation image. The image observation condition is changed to a condition expected to provide a better image, the adjustment items are again adjusted, and an observation image is acquired under the new image observation condition. The observation image is also retained, printed, etc. The operation is repeated several times for acquiring observation images under different image observation conditions. The observation images acquired under the different image observation conditions are compared with each other and the finally optimum image observation condition is determined. The SEM is again set to the optimum image observation condition and is adjusted, and an observation image is acquired and any desired operation is performed as required.

Thus, the optimum image observation condition must be set according to the trial and error technique of setting various conditions and comparing the provided images with each other for determining the optimum image observation condition; the work is extremely cumbersome and requires a skill. The operator skilled for observation under the SEM would be able to estimate a rough trend as to how the image observation condition will affect the observation image, but the actually obtained image is not determined until it is acquired and checked. Thus, the work is still cumbersome even for the skilled person. Work adjusting the picked-up observation image also becomes necessary; this also increases the time and labor of operation.

Further, the difficulty would be increased for the beginner. The beginner cannot grasp all characteristics of a specimen and cannot intuitively understand the effects of each condition and adjustment item. Further, the beginner cannot understand that there are correlation and limitation between the setup items of the image observation condition. For example, when the magnification is low, the spot size must be enlarged; when the magnification is high, the spot size must be lessened, or when a reflection electron detector is used as a detector, observation at a low acceleration voltage cannot be conducted. Thus, if the conditions are not understood, correct setting cannot be accomplished. Further, there is also a fear of breaking the apparatus as the objective lens is brought close to a specimen. As the distance between the objective lens and the specimen is shorter, air between the objective lens and the specimen is more lessened and thus generally a good image can be provided. However, if the objective lens and the specimen are brought too close to each other, the objective lens comes in contact with the specimen and breakage may occur. Thus, determining the setup condition requires experience and intuition and takes time and in addition, adjustment cannot be made to the optimum value.

In contrast, electron microscope, electron microscope operation method, electron microscope operation program, and computer-readable medium according to the invention provide a method of enabling even a non-skilled person to determine the optimum observation condition of the SEM, and also provide a method of enabling a skilled person to determine the optimum observation condition of the SEM in a short time without labor.

The observation image under the SEM is evaluated according to the following criterion complex: For example, whether or not charge-up appears on the image, whether or not the image quality is soft or hard, whether or not the S/N ratio is good, whether the resolution is high or low, whether or not asperity information is represented, whether or not the material quality difference is represented, whether the specimen information source is shallow or deep, how a corner and a protrusion are seen, the present or absence of stereoscopic effect, etc.

In the embodiment of the invention, to evaluate the images, observation images acquired under different image observation conditions are actually compared with each other and the optimum image observation condition is selected. The image observation condition is automatically set and the observation images are automatically acquired. Accordingly, the operator can select the optimum condition while seeing the images in a short time without labor and moreover without special knowledge about the SEM.

To realize this, in the embodiment of the invention, e-preview is executed. Thee-preview is as follows: To obtain the optimum observation condition, different recommended observation conditions are prepared simply in the electron microscope or computer, and observation images are acquired under the observation conditions and are listed as simple observation images. First, a plurality of sets of setting of changing one or more of setup items of image observation condition of the SEM are provided as simple image observation conditions. For example, a plurality of simple image observation conditions with the acceleration voltage and the detector type changed are generated automatically. The plurality of sets of simple image observation conditions provided are set in the SEM in order, and a specimen is observed consecutively under the conditions. The observed simple observation images are temporarily retained and are listed on a second display section. When the simple observation images are listed, they can be reduced for simultaneous display. The operator compares the displayed simple observation images and selects the image which seems to be the optimum. The operator again sets the simple image observation condition belonging to the selected image in the SEM and normally picks up an image for acquiring an observation image.

In the e-preview, normal image picking-up rather than simple image picking-up can also be performed. In this case, it takes time in drawing each observation image, but as for the selected observation image, the image data can be used intact without again picking up an image.

[Operation Flow of E-Preview]

An operation flow of e-preview will be discussed with reference to a flowchart of FIG. 27. It is assumed that before e-preview, a plurality of simple image observation conditions for executing e-preview are preset according to the above-described procedure.

First, at step S'1, one image observation condition is selected and set from among simple image observation conditions. The setting order of the simple image observation conditions is defined from lower acceleration voltage to higher acceleration voltage and from use of secondary electron detector to use of reflection electron detector.

At step S'2, a simple observation image is acquired based on the setup simple image observation condition. The acquired simple observation image is temporarily adjusted automatically. The adjusted image is temporarily retained at step S'3. The image data is stored in memory or on a record medium. One simple observation image is thus provided relative to one image observation condition.

At step S'4, whether or not another simple image observation condition exists is determined. If a simple image observation condition under which a simple observation image is not yet acquired exists, control returns to step S'1 and the above-described steps are repeated. In the embodiment, four simple image observation conditions are provided to acquire four simple observation images and thus a loop of steps S'1 to S'4 is repeated four times.

If simple observation images are thus acquired relative to all simple image observation conditions, control goes to step S'5 and the simple observation images are listed on the second display section.

The operation sequence of steps S'1 to S'5 is performed automatically in the apparatus. Thus, the operator can acquire the listed simple observation images as a result of e-preview at step S'5 without being conscious of it. Although reasonable images can be provided by automatic adjustment, it is generally difficult to provide the optimum image. Here, it is sufficient to grasp each observation image as a whole and thus even simple images can sufficiently accomplish the purpose. If simple display is produced under simple image observation condition and by simple image adjustment and the final image observation condition is determined, the optimum observation image can be provided based on the image observation condition. Here, the magnification is suppressed to 1000 times, etc., at the maximum. Accordingly, the whole image can be grasped and sufficient display is made possible without making astigmatism correction (described later), etc.

At step S'6, any desired image is selected from among the listed simple observation images and the simple image observation condition under which the image is acquired is set as the usual image observation condition. Normal image picking-up is again performed based on the image observation condition. At step S'7, necessary adjustment is made to the acquired observation image manually. The observation image thus provided is printed, retained, etc., as required.

[E-Preview More Than Once]

If necessary, e-preview can also be executed more than once for searching for the optimum condition under which a better observation image can be acquired. Referring to FIG. 28, first, at step S"1, a plurality of simple image observation conditions for executing e-preview are generated. The e-preview is executed based on the simple image observation conditions. The e-preview operation is similar to the procedure at steps S'1 to S'5 previously described with reference to FIG. 27. At step S"3, any desired simple observation image is selected from among listed simple observation images thus provided. At step S"4, whether or not e-preview is to be again executed is determined. The purpose of again executing e-preview is to narrow down image observation conditions to set the image observation conditions in more detail, to again execute e-preview from the beginning under any other condition if any desired image is not provided, or the like. To again execute e-preview, control jumps to step S"7 and new simple image observation conditions are set. At the time, the electricity of the specimen can be eliminated as required, because the specimen may be charged up as simple image picking-up is performed.

Figure 27:
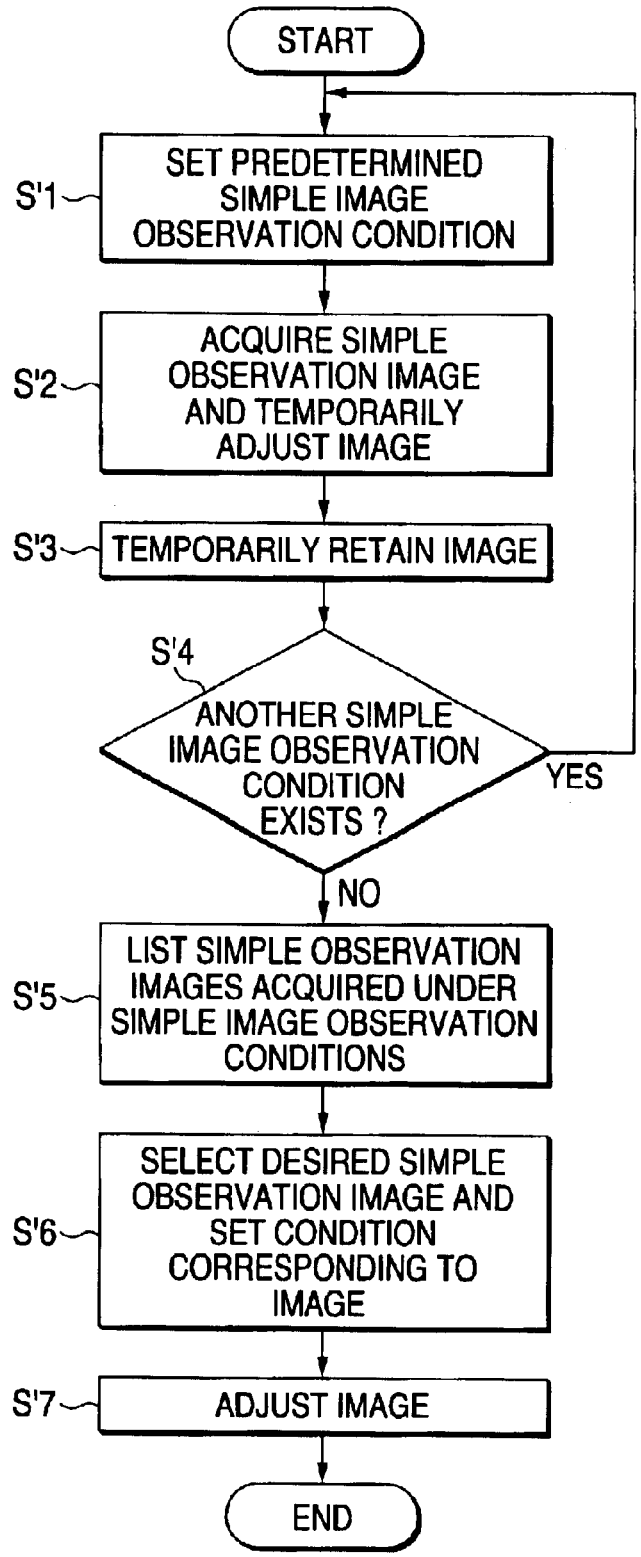
FIG. 27 is a flowchart to show an operation flow of e-preview.
Figure 28:
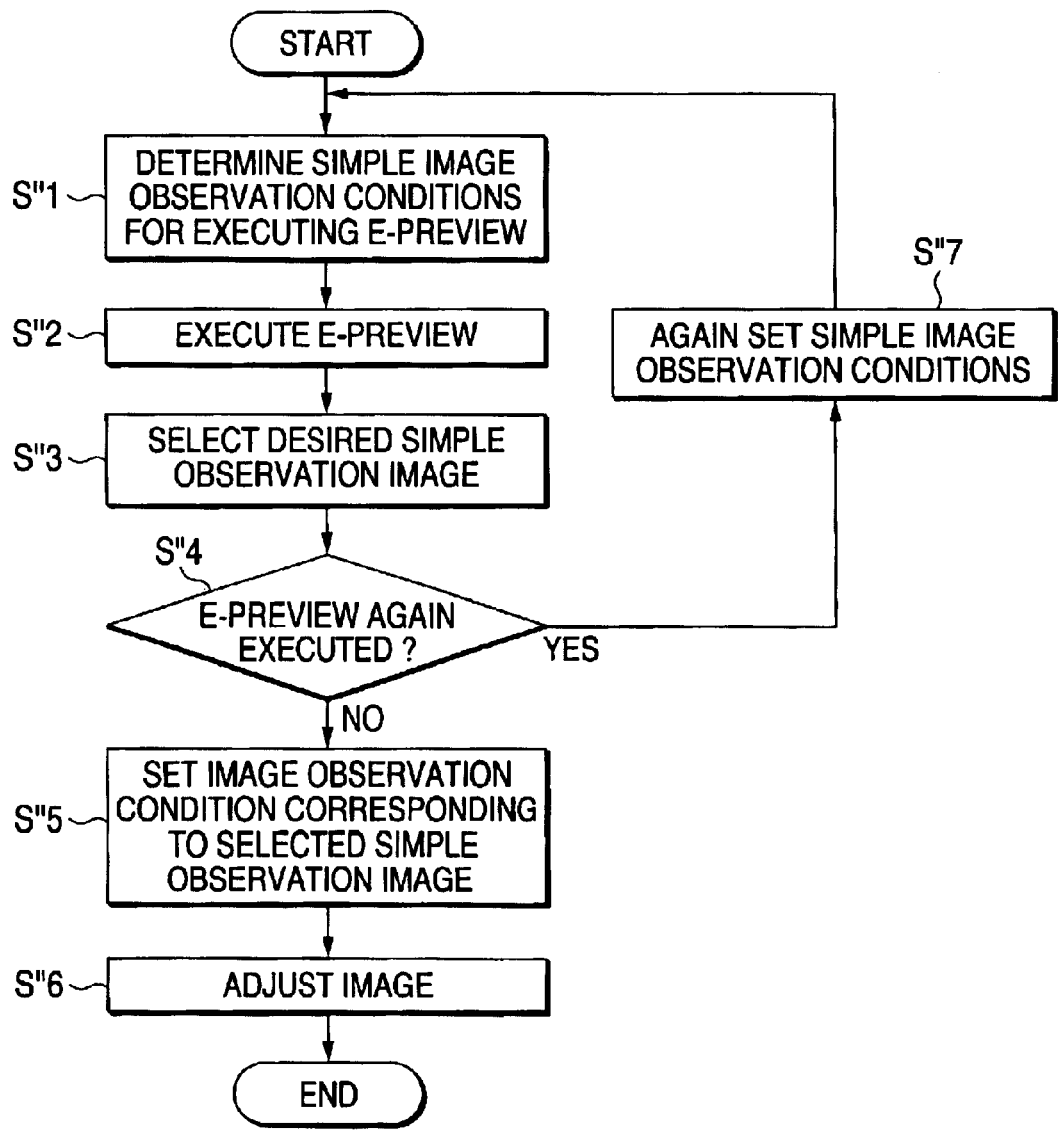
FIG. 28 is a flowchart to show an operation flow of executing e-preview more than once.

If any desired simple observation image is finally provided according to the procedure described above, control goes to step S"6 and adjustment similar to that at step S'7 in FIG. 27 is made as required.

[Image Observation Condition Setting to Repeat E-Preview More Than Once]

Image observation condition setting to repeat e-preview more than once is performed as follows:

To find the optimum value of one parameter, a method of searching in all range in fine change amount as much as possible, acquiring simple observation images, and comparing the simple observation images with each other is available, but takes much time. Then, the change amount is taken large, rough searching is performed, and an area is specified to some extent, finer searching is performed. Accordingly, the time can be shortened. In this method, e-preview is executed more than once.

For example, considering a search for the maximum value of acceleration voltage not charging up the specimen as a parameter, the change amount is set to 0.3 kV at the first e-preview, and four acceleration voltages of 0.8 kV, 1.1 kV, 1.4 kV, and 1.7 kV are set as simple image observation conditions. As a result, simple observation images where charge-up does not occur at 0.8 kV or 1.1 kV and occurs at 1.4 kV or more are acquired. In this case, charge-up occurs between 1.1 kV and 1.4 kV. Then, at the second e-preview, the change amount is set to a finer value of 0.1 kV for narrowing down the optimum acceleration voltage. At the second e-preview, simple observation images are acquired at 1.1 kV, 1.2 kV, 1.3 kV, and 1.4 kV. If it is determined that charge-up does not occur at 1.3 kV or less and occurs at 1.4 kV, the maximum acceleration voltage not charging up can be found to be 1.3 kV. In each e-preview operation, electricity elimination operation is performed for removing charges accumulated in the specimen, needless to say. The number of times e-preview has been executed maybe displayed on a screen. For example, "e-preview, second time" or the like is displayed on a screen in FIG. 15.

[Conditions to Execute E-Preview]

In e-preview, the images are adjusted automatically. Accordingly, the operation sequence to acquire a plurality of images can be completed without the need for the operator to adjust the images, and can be performed smoothly and rapidly. As automatic adjustment is made, accuracy is a little degraded as compared with manual adjustment. However, there is no problem because e-preview is simple image picking-up and it is sufficient to enable image evaluation to select the optimum image observation condition.

Each image is temporarily retained with the image provided at raised frame rate, whereby the time to acquire a plurality of images can be shortened. Usually, it requires 30 seconds to one minute per image in drawing a high-definition image in the SEM. With one image, the S/N ratio is poor and thus at the usual image picking-up time, 10 or more images are acquired at the frame rate of about a quarter of one second per image and are averaged for display. Therefore, it takes two seconds or more to acquire one image. It may take 30 seconds or more to provide a detailed observation image for print. Then, in the embodiment of the invention, the number of images to be averaged is reduced to eight or four, the scanning range of an electron beam over a specimen is narrowed, and scanning is thinned, etc., for raising the frame rate, thereby shortening the time until an image is acquired.

[Astigmatism Correction]

To eliminate the need for executing astigmatism correction, the maximum magnification is limited, whereby labor of astigmatism correction can be saved and the processing time can be shortened. As for astigmatism correction, automatic adjustment may not well function and if automatic adjustment results in failure and an image does not appear, image evaluation is hindered and manual adjustment becomes necessary. Then, at the stage of e-preview, limitation is placed so as to make it impossible to much raise the magnification, and the necessity for adjustment of astigmatism correction is decreased. For example, if the maximum magnification is set to 10000 times, a sufficient image evaluation level can be maintained with the default value of astigmatism correction intact. A sufficient image can be provided without making automatic adjustment, so that adjustment work can be skipped and processing can be advanced easily and rapidly. Alternatively, the value of astigmatism correction in each condition may be previously retained in a table, etc., and may be referenced, whereby the appropriate astigmatism correction value may be set.

[E-Preview Execution Order]

To acquire simple observation images under a plurality of image observation conditions in e-preview, it is desirable that the condition execution order should be considered. Order not receiving the effect of charge-up.

Acceleration voltages are set in the ascending order in such a manner that the voltage value is raised in order from low to high. Generally, as the acceleration voltage is higher, the specimen is charged more easily and thus the acceleration voltage is raised gradually from low voltage, whereby the effect of charge-up can be lessened.

[From Secondary Electron Detector to Reflection Electron Detector]

To change the detector type, first a secondary electron detector is used and then is changed to a reflection electron detector. A secondary electron can be detected even at low acceleration voltage. In contrast, at low acceleration voltage, a reflection electron does not arrive at a detector and thus generally requires high acceleration voltage as compared with the secondary electron. Therefore, observation of the secondary electron detector applying acceleration electrons at low acceleration voltage is first executed and then measurement of the reflection electron detector is conducted.

If the acceleration voltage is changed, the optimum image observation condition is also changed and thus adjustment work needs to be again performed from the beginning. In contrast, if the acceleration voltage is constant, adjustment work may be performed only once. Thus, if measurement of the secondary electron detector is first conducted and then the secondary electron detector is changed to the reflection electron detector at the same acceleration voltage, adjustment work becomes unnecessary if other setup, items are not changed at the same acceleration voltage. Therefore, work of automatic adjustment can be skipped for shortening the processing time.

[Setting Simple Image Observation Conditions for E-Preview]

To set a plurality of simple image observation conditions, any of the following methods can be used:

(1) The number of simple image observation conditions and the contents are set to fixed values. For example, the number of simple image observation conditions is set to two and the contents are set for each of secondary electron detector and reflection electron detector. Other items are set to conditions fitted for each detector.

(2) A change item is specified. For example, if a condition of changing only acceleration voltage is specified, 0.5 kV, 1.0 kV, 2.0 kV, 5.0 kV, 15 kV, 20 kV, and the like are set. The change amount maybe a fixed value or may be increased or decreased or irregular values can also be specified. Other items are set to conditions fitted for the values.

(3) A plurality of settings are provided. Simple image observation conditions are presented for selection so that the operator can select the condition in response to the specimen to be observed, the observation purpose, etc. For example, there are provided setting groups with condition changed for one or more setup items such as a setting group of changing the acceleration voltage to 0.5 kV, 0.8 kV, 1.1 kV, and 1.5 kV as setting of the specimen as an insulator or for charge-up check, a setting group of acceleration voltage 1 kV, 5 kV, 20 kV with secondary electron detector and 20 kV with reflection electron detector as setting of combination of acceleration voltage and detector for observation of a conductor specimen, a setting group of changing only the magnification to 100 times, 1000 times, and 10000 times for magnification determination, and a setting group of changing the vacuum degree to 200 pa, 100 pa, 50 pa, and 10 pa for vacuum degree determination.

(4) A plurality of image observation conditions with all setup items adjusted so as to be fitted for a specific specimen or observation purpose without continuously changing only a specific setup item are provided and any desired condition is selected. The operator can select any desired condition and acquire a simple observation image under the selected condition. This method is appropriate for examining what image is provided without searching for the maximum value from a specific parameter. For example, there are provided fitted simple image observation conditions such as a condition fitted when the specimen is fiber, a condition placing importance on the resolution, a condition reducing specimen damage, a condition fitted for a biological specimen, a condition for low magnification, and a condition with small contamination of specimen. Each condition includes all setup items.

(5) Previously selected image observation conditions are used. The previously used observation images and the image observation conditions corresponding thereto are recorded and retained and are called, so that any of the conditions can be set. For example, any desired image is selected out of the folder storing the picked-up observation images, and the condition applied when the image was observed is copied for setting to the same simple image observation condition. In this method, the previously used image observation conditions need to be recorded and retained. To facilitate later selection, for example, the acquired image data is displayed as thumbnail for reminding the operator of the images and conditions or each image and the image observation condition corresponding thereto are given the date, the specimen, and any other description with a name for storage, whereby easy use can be made in later selection and retrieval.

Figure 4:
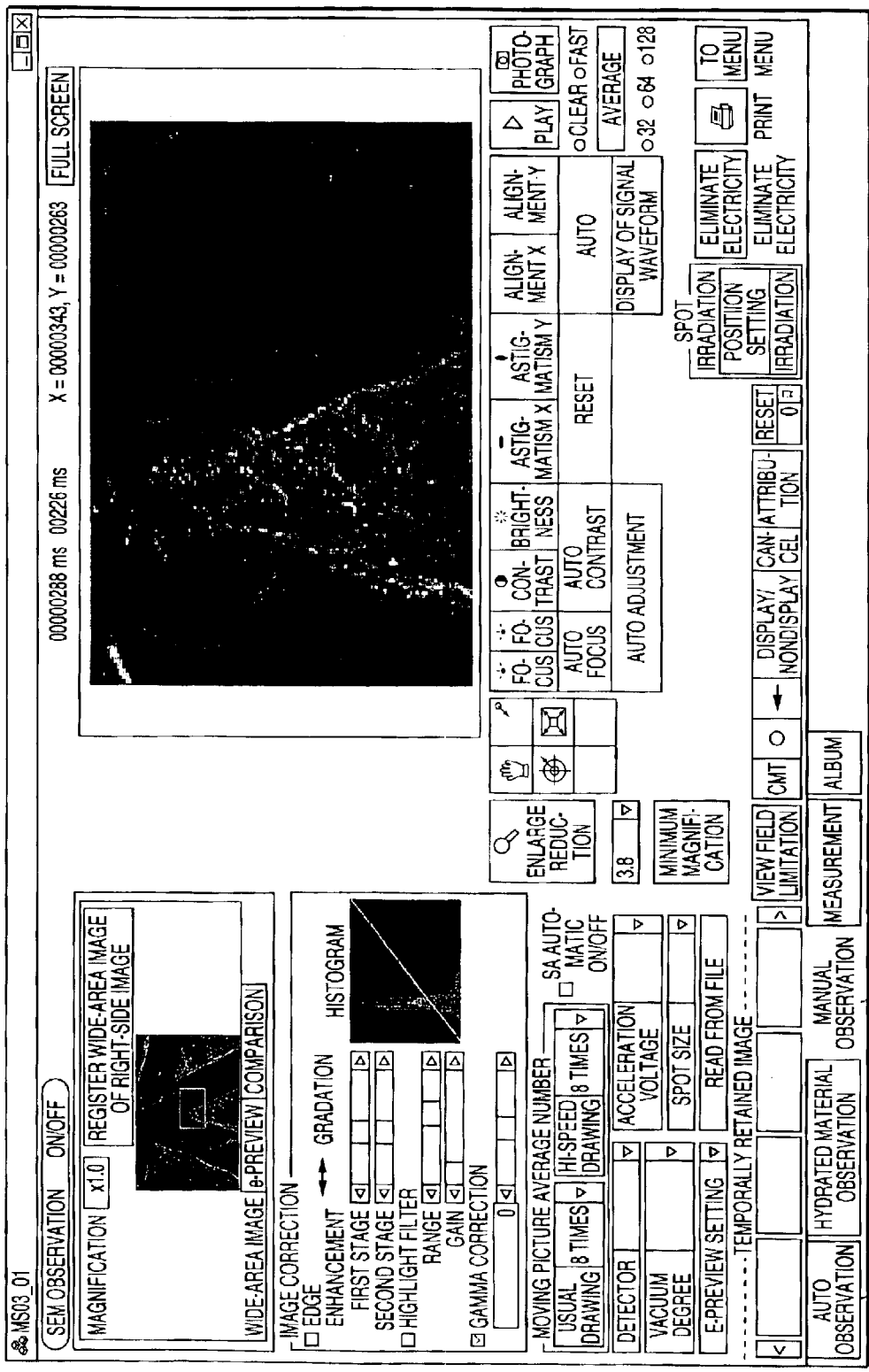
FIG. 4 is an image drawing to show a manual observation mode of the scanning electron microscope operation program according to the embodiment of the invention.

(6) The operator can set all conditions as he or she desires. This method is manual setting of conventional type as shown in FIG. 4.

(7) New conditions are generated based on the previously used simple image observation condition. For example, if the immediately preceding image observation condition is acceleration voltage 2.0 kV, a condition with the acceleration voltage changed to values preceding and following that value is set. For example, this method can be used for making fine adjustment to an observation image acquired in manual observation mode. [Use Mode of E-Preview]

Figure 29:
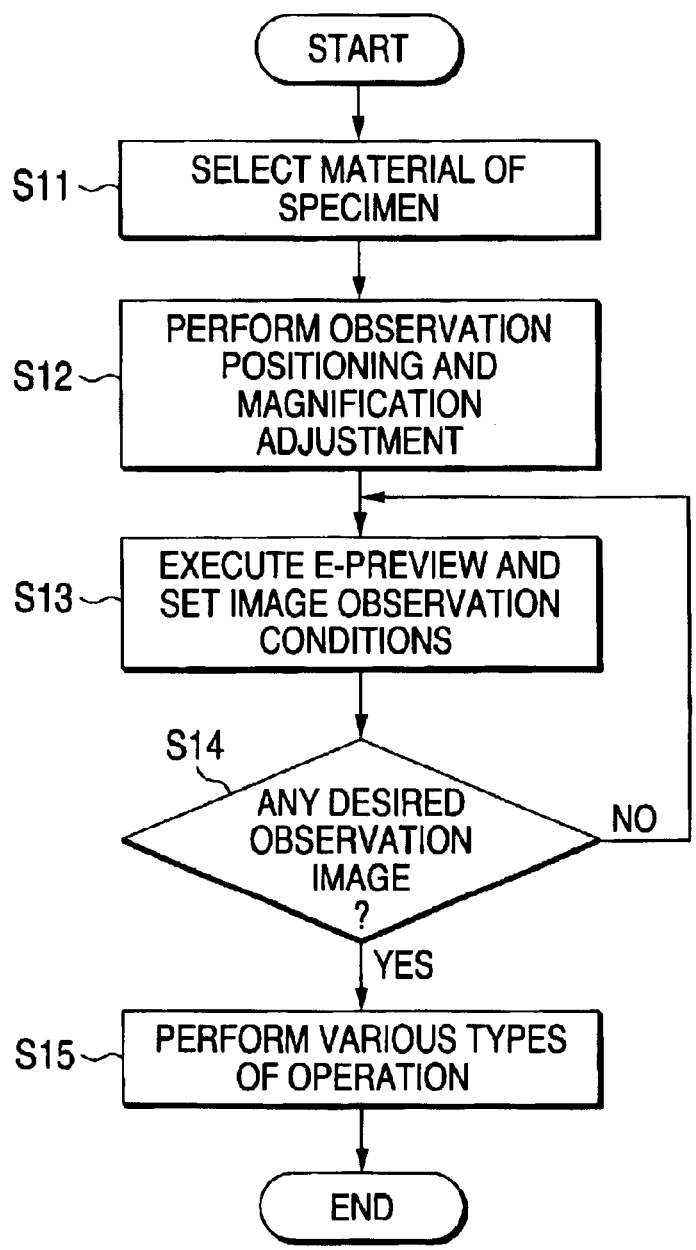
FIG. 29 is a flowchart to show one use mode of e-preview in the auto observation mode.

In an example in FIG. 29, use of e-preview in auto observation mode will be discussed. In the auto observation mode, the operator is guided in operation by a guidance function as described later.

[Step S11: Select Material of Specimen]

First, the material of specimen is selected. A temporary image observation condition is set in response to the selected material, applying of an electron beam is started based on the setting, and a temporary observation image is acquired. The temporary observation image is displayed on the first display section at a low magnification at first for easy adjustment.

[Step S12: Perform Observation Positioning]

Next, observation positioning and magnification adjustment are performed based on the temporary observation image.

[Step S13: Execute E-Preview]

A plurality of image observation conditions are computed based on the temporary observation image positioned and adjusted in magnification at step S12. The e-preview is executed based on the computed image observation conditions and a plurality of simple observation images are acquired and are simultaneously listed on the second display section.

[Step S15: Perform Various Types of Operation]

Any desired simple observation image is selected from among the displayed simple observation images, the image observation condition corresponding to the selected simple observation image is set, and usual image picking-up is performed. Any desired operation is performed for the observation image thus provided. For example, image print, retention, dimension measurement, and the like are performed.

Figure 30:
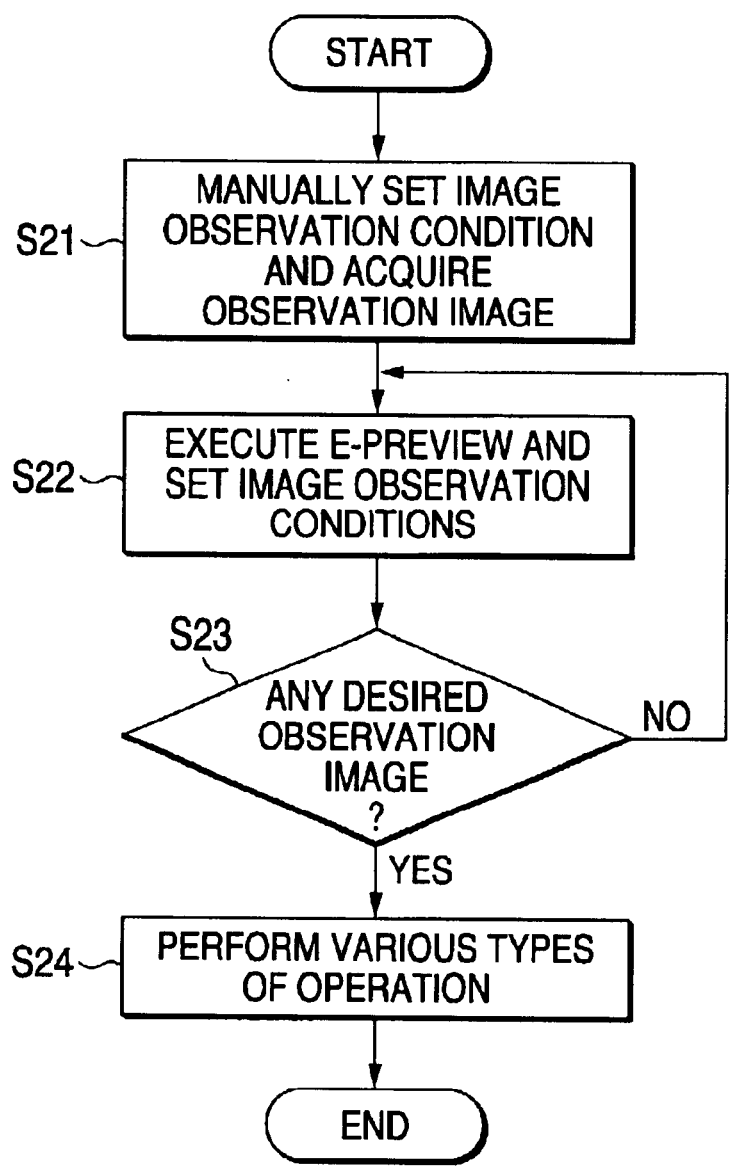
FIG. 30 is a flowchart to show one use mode of e-preview in the manual observation mode.

In an example in FIG. 30, after the operator sets image observation condition in the manual observation mode, e-preview is executed.

[Step S21: Manually Set Image Observation Condition]

First, the operator manually sets the image observation condition which seems to be the optimum. Manual observation mode in FIG. 4 is selected and the detector type, the vacuum degree in the specimen chamber, acceleration voltage, and spot size are set as setup items. After the setup items are set, applying of an electron beam is started and an observation image is acquired. Further, observation positioning and magnification adjustment are performed for the observation image as required.

[Step S22: Execute E-Preview]

Further, e-preview with the image observation condition changed is executed for the current observation image being displayed. It may be difficult to determine whether or not the observation image provided as the condition which seems to be the optimum is manually set is actually the optimum, and a search may be made for the optimum condition in a trial-and-error manner in change to various conditions to provide a better image. In such a case, e-preview can be executed, a plurality of image observation conditions with the setup items changed can be set automatically, and simple observation images can be acquired easily. The operator compares the simple observation images listed on the second display section as a result of e-preview execution, selects any desired simple observation image, and further adjusts the simple observation image as required.

[Step S23: Any Desired Observation Image Provided?]

Additional e-preview can also be executed for the observation image provided by execution of the e-preview at step S22. In the additional e-preview, in addition to setting the condition similar to that at step S22, the condition can be changed to a different condition, a more detailed condition, such as lessening the setup width of the acceleration voltage. As e-preview is executed repeatedly, a search can be made for the optimum condition in more detail. Accordingly, even the skilled operator can easily search for the optimum condition because various conditions are automatically set and the operator can check and compare the observation images provided under the conditions.

The step is arbitrary and the number of times e-preview is executed may be one or may be any (two or more).

[Step S24: Perform Various Types of Operation]

If any desired observation image is thus provided, any desired operation is performed for the observation image in a similar manner to that described above.

[Select Previous Image Observation Condition]

Figure 31:
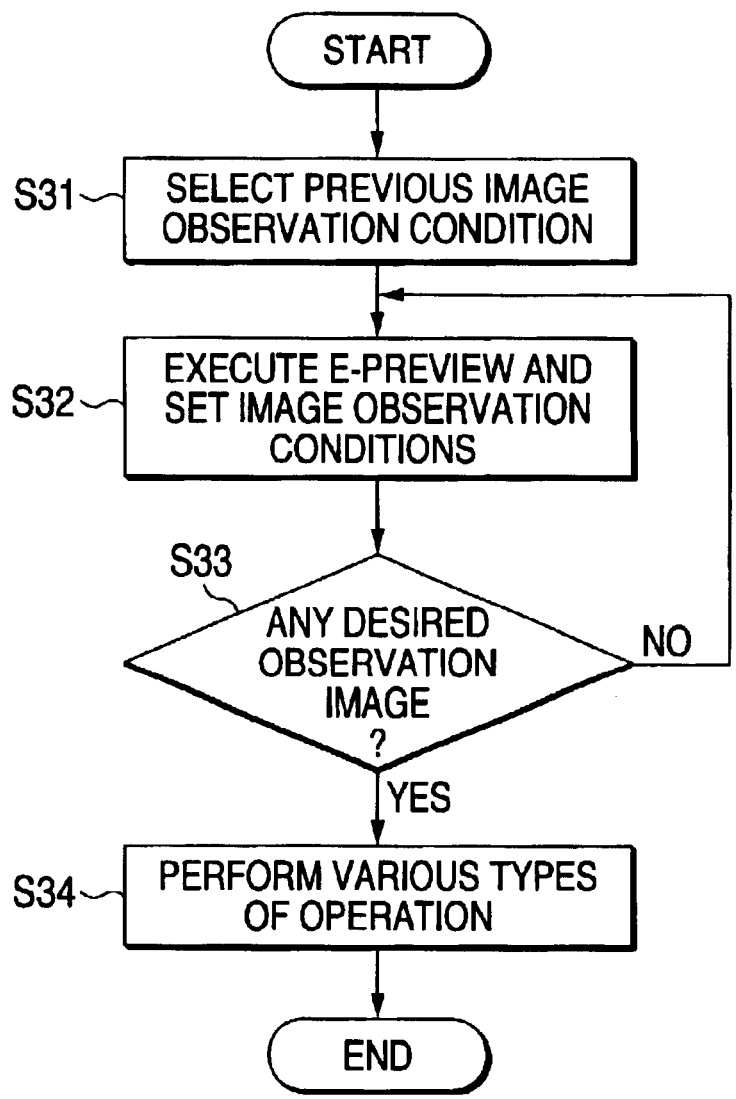
FIG. 31 is a flowchart to show a use mode of executing e-preview using the previous image observation condition.

As shown in FIG. 31, the image observation condition used for previous image observation can be used to pick up an image and e-preview can be executed. For example, an image observation history is recorded and any desired condition is selected from among the conditions used in the past and is used to pick up an image. The electron microscope or the computer is preset so as to automatically record the history each time an image is picked up. The history data may be retained as desired by the operator rather than automatically. The retention mode may be temporary retention of erasing old data in order within a predetermined data capacity or may be permanent retention of retaining all data. The recorded history data is retained and thus can be called as required. The attributes of the image pickup date, the number of use times, etc., can also be stored together with each piece of the history data, whereby it is also made possible to sort and search for the history data in the date order, the use frequency order, etc. Search is also possible from the setup contents of the image observation conditions; for example, processing of extracting conditions of acceleration voltage 20 kV or more is also possible. Relating with data of the observation image acquired under each image observation condition is also possible. For example, the retention location of the image data of each observation image is stored and the observation image is called as required or the image data is reduced and icon display is produced, so that improvement in ease of use such that the user can make image selection or easily call the previous operation to mind is also possible.

Figure 32:
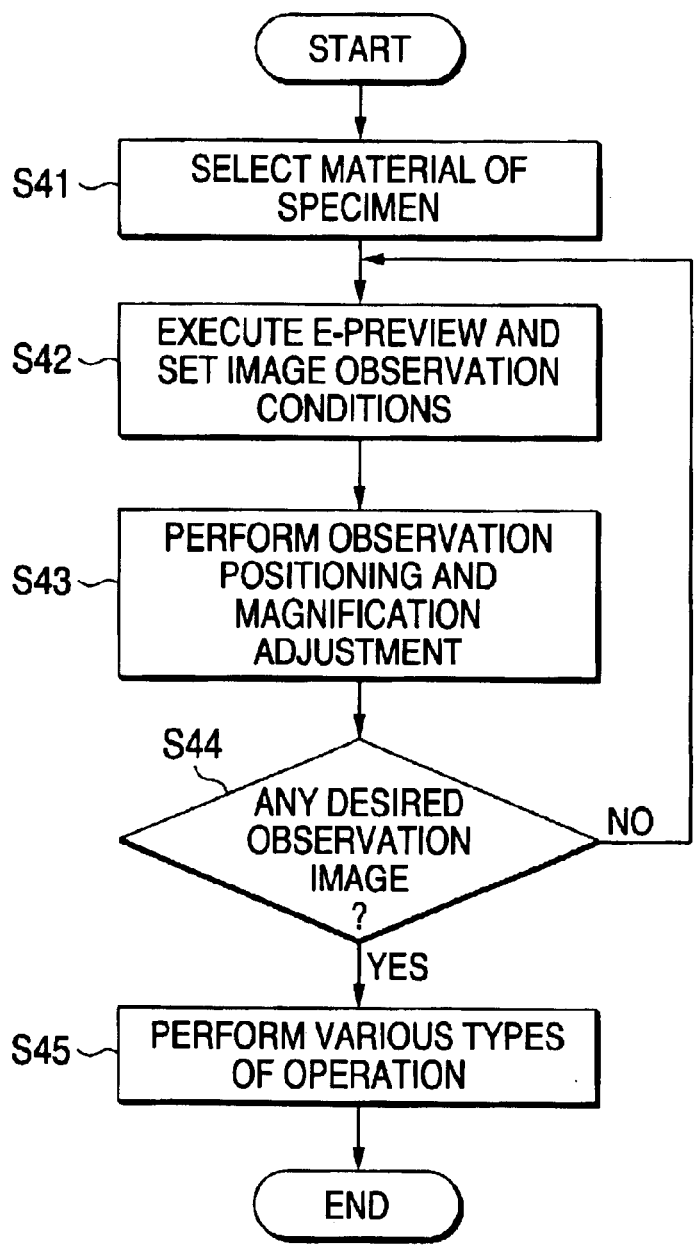
FIG. 32 is a flowchart to show another use mode of e-preview in the manual observation mode.

Further, a flowchart of FIG. 32 shows another use mode of e-preview in the auto observation mode. In this example, e-preview is executed before positioning and magnification adjustment, whereby an observation image picked up under an appropriate condition is first acquired and then adjusting of positioning, etc., is performed based on the clear image. Accordingly, more precise adjustment is made possible and labor of readjusting after the optimum image is acquired is lightened.

[Step S41: Select Material of Specimen]

The material of specimen is selected. A temporary image observation condition is set in response to the selected material, applying of an electron beam is started based on the setting, and a temporary observation image is acquired. The temporary observation image is displayed on the first display section at a low magnification at first for easy adjustment.

[Step S42: Execute E-Preview]

A plurality 6f image observation conditions are computed based on the temporary observation image displayed at low magnification before adjustment. The e-preview is executed based on the computed image observation conditions and a plurality of simple observation images are acquired and are simultaneously listed on the second display section.

[Step S43: Perform Observation Positioning]

Any desired simple observation image is selected from among the displayed simple observation images, and observation positioning and magnification adjustment are performed for the simple observation image. At this point in time, the desired simple observation image is selected and thus the operator can make adjustment to the clear image.

[Step S45: Perform Various Types of Operation]

Any desired operation is performed for the adjusted observation image as required.

Further, e-preview can also be executed based on a preset condition. A plurality of image observation conditions which seem to be appropriate for various specimens are previously registered and the operator selects any of the image observation conditions or the electron microscope or the computer automatically detects the specimen type and the image observation condition, whereby image observation is conducted based on the default values. Since observation is conducted based on the initial values, an adjusted image is not necessarily acquired, but the operator needs only to select any desired condition setting and thus a reasonable image can be acquired extremely easily. It is also possible to add adjustment with e-preview, etc., as described above as required, needless to say.

[Execute E-Preview Before any Desired Operation]

Figure 33:
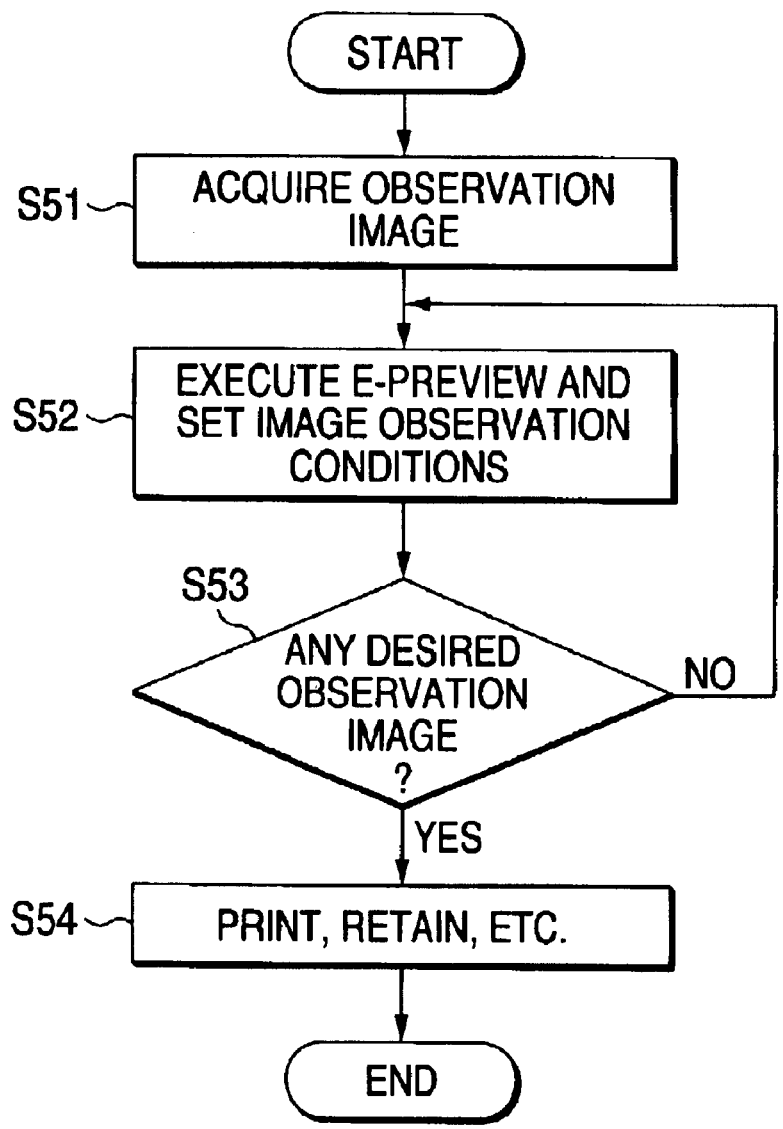
FIG. 33 is a flowchart to show a use mode of executing e-preview before any desired operation.

In an example in FIG. 33, e-preview is executed before operation of retention, print, etc. For example, although a sufficient image is provided on the screen of the display section, if the operator wants to make the image quality better before print or retention, e-preview is executed and a more desirable image is selected and adjusted. Separate adjustment may be added so as to provide an image fitted for print or an image fitted for retention.

[Mode]

The electron microscope comprises a first image observation mode screen provided with a guidance function of guiding the operator in setting to facilitate operation of the electron microscope and a second image observation mode screen for enabling the operator to set the electron microscope in a conventional manner. The first image observation mode screen provides an easy mode for guiding the operator in setting of necessary items to make it possible to automatically set the electron microscope to some extent so that a reasonable observation image can be acquired even if the operator is unfamiliar with operation of, the electron microscope. The first image observation mode is represented as AUTO OBSERVATION 40 on a menu screen of an electron microscope operation program shown in FIG. 2. FIGS. 2 and 4 and later show images of user interface screens of the electron microscope operation program.

On the other hand, the second image observation mode screen is a usual setting screen and provides a professional mode for a person skilled in operation of the electron microscope to set the electron microscope in detail to acquire an optimum observation image. The second image observation mode is represented as MANUAL OBSERVATION 41 in FIG. 2. FIG. 4 shows a screen example of the manual observation mode. In the manual observation mode, the operator sets all setup items. The screen does not guide the operator in setting and enables the operator to perform every possible type of operation at all times so that the operator can determine the operation at any timing.

[Image Observation Condition]

The image observation condition required for providing an observation image under the SEM is to determine an appropriate acceleration voltage value in response to a specimen as the electron gun high-voltage power supply 3, etc., is adjusted in acceleration voltage, to set the electron beam applied from the electron gun to any desired spot size (diameter of incident electron beam bundle), etc., for example. Any other image observation condition than the acceleration voltage or the spot size includes selection of any of secondary electron detector, reflection electron detector, etc., as a detector, the vacuum degree in the specimen chamber 31, the magnification, the observation position of a specimen, namely, the X, Y, R axis position of the specimen table, the tilt angle of a specimen, namely, the T axis position of the specimen table, the working distance, namely, the Z axis position of the specimen table, the objective stop diameter, etc.

The adjustment items are items which need to be adjusted only once and items which need to be adjusted each time the image observation condition is changed. For example, the current value for heating the filament to generate heat electrons from the electron gun needs to be adjusted only once at the operation starting time of the electron microscope. In contrast, adjustment items of an acquired observation image include focus, contrast, brightness, astigmatism correction, optical axis adjustment (gun alignment), etc. Generally, as the magnification becomes higher, it becomes difficult to adjust each item, and the difference between unadjusted and adjusted images becomes noticeable. The operator sets the items by operating necessary buttons and menus on the screen.

The operator of the electron microscope can switch the observation mode between the auto observation mode and the manual observation mode by selecting an AUTO OBSERVATION tab 42 or a MANUAL OBSERVATION tab 43 provided at the bottom in FIG. 4. The operator can switch the observation mode from the manual observation mode to the auto observation mode or from the auto observation mode to the manual observation mode at any time. Accordingly, it is made possible to acquire a reasonable observation image in the auto observation mode and then switch into the manual observation mode to adjust to optimum setting for providing a more detailed observation image, for example, as a use mode.

[Electron Microscope Operation Method of in Auto Observation Mode]

As an electron microscope operation method according to one embodiment of the invention, image observation in the auto observation mode will be discussed with reference to operation screens in FIGS. 6 to 15 and 24 to 26. Each drawing shows an example of the user interface screen displayed on the computer or the electron microscope. The design and layout of each screen, button layout, color arrangement, icon shapes, and the like can be changed whenever necessary, needless to say.

Figure 5:
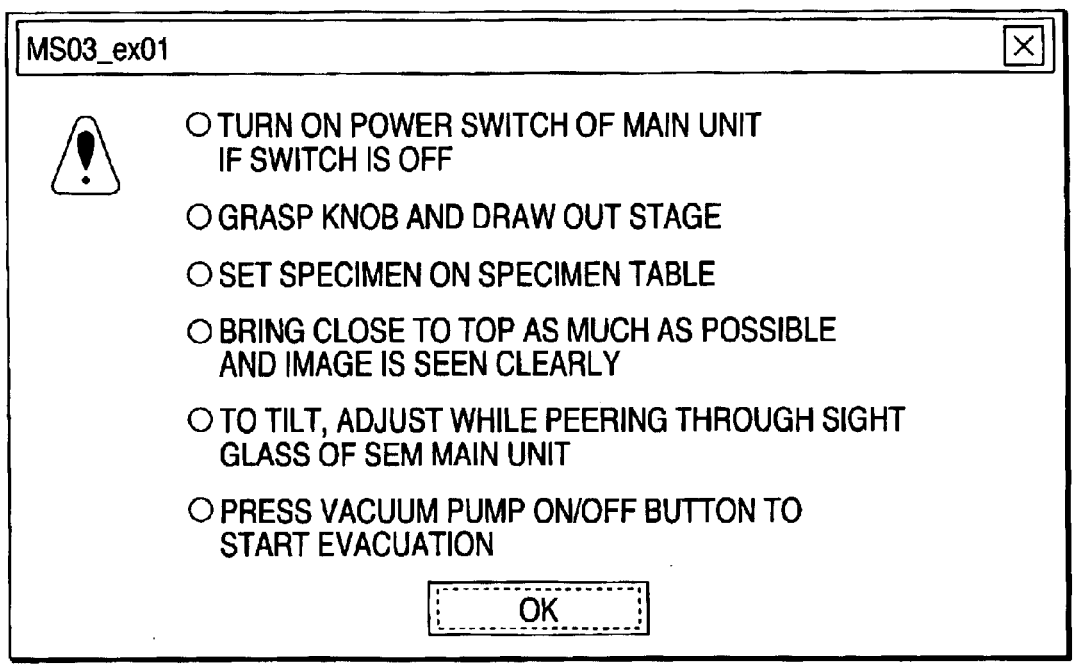
FIG. 5 is an image drawing to show an example of a message screen for giving cautions in operating the electron microscope.

First, when the electron microscope operation program is started, a selection screen in FIG. 2 is displayed on a screen of the computer 1 in FIG. 1. The selection screen displays various operation selection buttons together with the description of the operation contents. The operator selects any desired operation and presses its corresponding button. Here, if the operator presses the AUTO OBSERVATION 40, the screen changes to a screen in FIG. 6 and the auto observation mode is started. In the auto observation mode, necessary setup items are displayed for each screen according to the guidance function. Each setup item is described with text, voice, a still picture of illustration, photo, etc., a moving picture of animation, etc., alone or in combination as required. The necessary setup items can also be highlighted as blinking, reverse display, etc. In addition, a message can also be displayed as a caution for the operator whenever necessary. For example, when a transition is made to the auto observation mode, a message screen as shown in FIG. 5 can be displayed for prompting the operator to check the items to be noted.

Further, warning means may be provided for informing the operator that the entry contents are erroneous when setting not allowed in each setup item is entered. To give a warning, not only a method of displaying a text message, but also a method of producing a warning beep, playing back a voice message, etc., can be used. Limitation can also be placed on a specific item so as to inhibit setting or change for preventing malfunction. Further, an operation item requiring no setting may be suppressed in screen display.

The operator repeats operation of pressing a NEXT button to advance to a setup item on the next screen after termination of setting on each screen, whereby the operator can execute necessary setting step by step for finally acquiring an observation image. To return the setup screen to the preceding screen, the operator presses a BACK button, whereby the operator can again execute setting from the beginning.

[Step S1: Select Material of Specimen]

Figure 6:
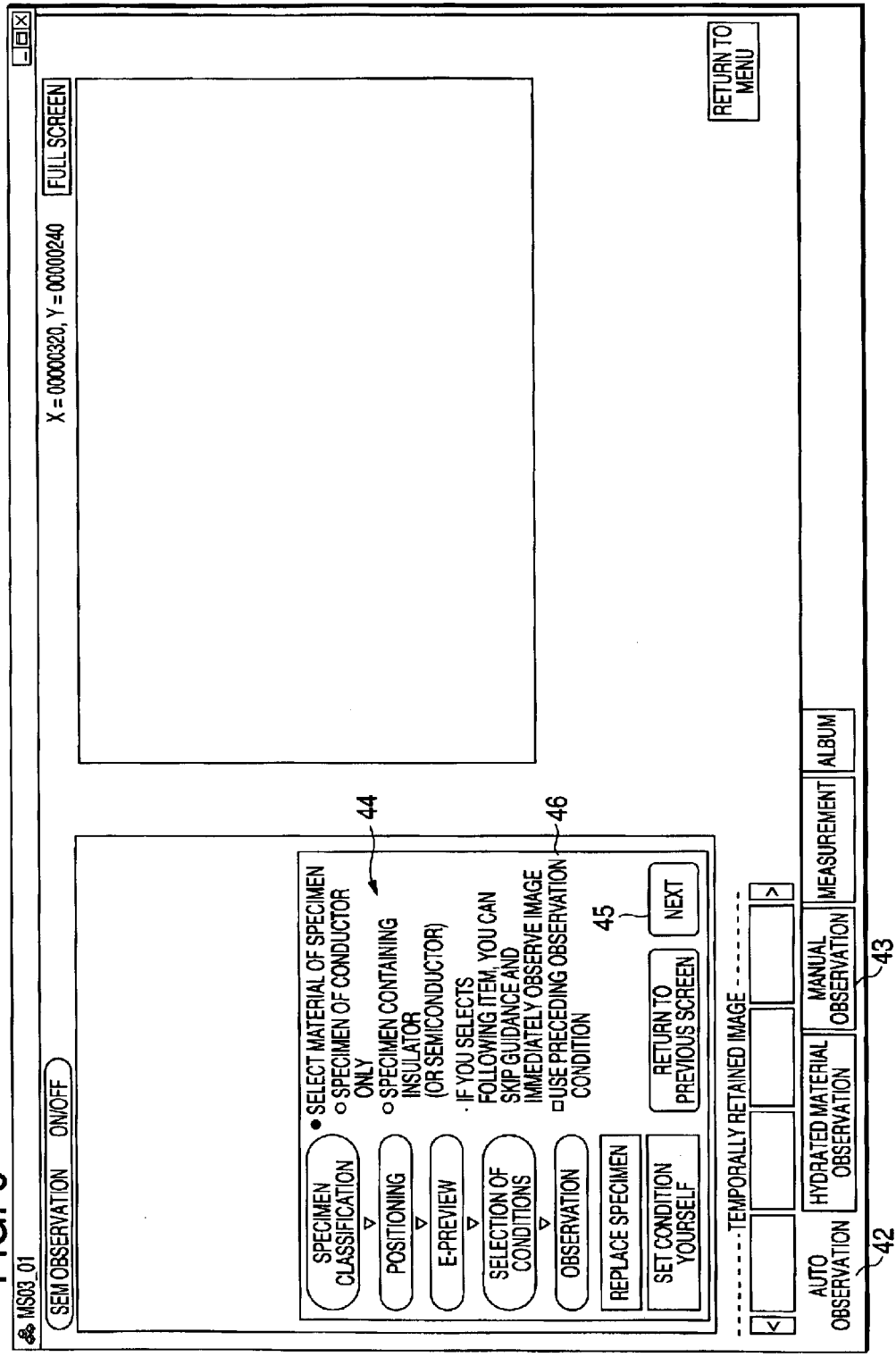
FIG. 6 is an image drawing to show a specimen classification screen in the auto observation mode in the scanning electron microscope operation program according to the embodiment of the invention.

FIG. 6 shows a specimen classification screen provided with a specimen classification field 44 for requesting the operator to select the material of a specimen. The operator uses a radio button to specify whether the specimen whose image is to be observed is made of a conductor only or contains an insulator or a semiconductor. The acceleration voltage and the spot size are determined in response to the electrical conductivity of the specimen. If the specimen is electrically conductive, there is no fear of charge-up, but if the specimen contains an insulator or a semiconductor, there is a fear of occurrence of charge-up and thus care needs to be taken so as not to excessively raise the acceleration voltage. The electron microscope or the computer automatically determines both the acceleration voltage and the spot size in accordance with the selection.

The setting is setting for acquiring an observation image to perform positioning on the next screen and not for acquiring an optimum observation image. To acquire an observation image, an electron beam must be applied under some condition, but the optimum condition cannot be determined at the point in time. The acceleration voltage and the spot size are set to safe values aiming at acquiring an observation image without giving a high priority to the observation image quality so as to make it possible to acquire an observation image whose whole image can be determined to such an extent that positioning can be performed. Further, the magnification is set a low value so that the whole of the image can be acquired. If the operator selects the material of the specimen, the NEXT button 45 is changed from gray-out mode to selectable mode. If the operator presses the NEXT button 45, a transition is made to a positioning screen in FIG. 7, applying an electron beam is started based on the setup acceleration voltage, and image observation at low magnification is conducted.

To conduct image observation under the same image observation condition as the preceding image observation condition, the operator checks a USE PRECEDING IMAGE OBSERVATION CONDITION box 46. If the operator checks the box and presses the NEXT button 45, the operator can skip guidance and immediately advance to image observation.

[Simple Acceleration Voltage and Spot Size Determination Technique]

Here, a technique of simply determining the acceleration voltage and the spot size by the electron microscope or the computer will be discussed. Even for simple observation, it is desirable that several conditions should be satisfied. For example, to observe a specimen easily charged up, the specimen needs to be observed under the condition not charging up the specimen. If the specimen easily undergoes damage such as thermal deformation or evaporation, the specimen must be observed under the condition for preventing damage to the specimen. In addition, the condition needs to be set so as to observe the specimen as clear as possible. Further, in addition to the acceleration voltage and the spot size, all parameters required for observation must be set to actually form an observation image.

As the technique of simply determining the acceleration voltage and the spot size, the following procedure can be used:

[Characteristics of Specimen]

First, the operator specifies conductivity of the specimen. For example, the operator selects the presence or absence of electric conductivity of the specimen. Alternatively, the operator selects semiconductor or mixed specimen.

Further, the operator specifies heat resistance of the specimen. The operator specifies whether or not the specimen becomes easily deformed due to heat and whether or not the specimen contains a component easily evaporated, such as water content. If the specimen is a stable specimen such as metal, there is no problem if an electron beam is applied; if the specimen is an unstable specimen, there is a fear of giving damage to the specimen by electron beam application. Thus, the electron beam application condition is adjusted in response to the nature of the specimen.

The operator also specifies the structure of the specimen. For example, the operator specifies which of lump, powder, granular material, and aggregate of elongated substances such as fibers the specimen is, and condition settings responsive thereto are provided as a temporary setting candidate group. If the specimen is a lump, the operator specifies more detailed conditions such that the specimen has minute asperities on the surface, that the surface is flat, and that coating of gold evaporation, etc., or any other pretreatment is applied to the surface, and conditions appropriate therefor are provided.

Further, a setting group responsive to an observation purpose is provided. As the operator specifies an observation purpose, automatically the corresponding setup value is set. For example, the operator selects the purpose of conducting X-ray element analysis, checking a distribution of the composition making up the specimen, checking an uneven substance, checking the specimen through thin oil content deposited on the specimen surface, or the like, and provided setting group appropriate therefor is used.

Other image observation condition parameters are set in response to the acceleration voltage and the spot size simply set as described above. For example, to adjust the optical axis, namely, adjust the straight line through the centers of the lenses, stops, etc., of the optical system as the line passing through the optical system, appropriate optical axis adjustment values are provided as a table in response to the relationship between the acceleration voltage and the spot size, and the table is referenced, whereby the corresponding optical axis adjustment is made.

To set the acceleration voltage and the spot size, not only the method of adjusting both the acceleration voltage and the spot size, but also a method of adjusting the other with one set to a fixed value may be adopted.

In addition, the specimen can also be observed with both the acceleration voltage and the spot size set to fixed values rather than according to the above-described technique. At the time, it is desirable that the acceleration voltage and the spot size should be set to acceptable values with a view to acquiring an observation image rather than to acquiring an optimum image.

[Step S2: Perform Observation Positioning and Magnification Adjustment]

Figure 7:
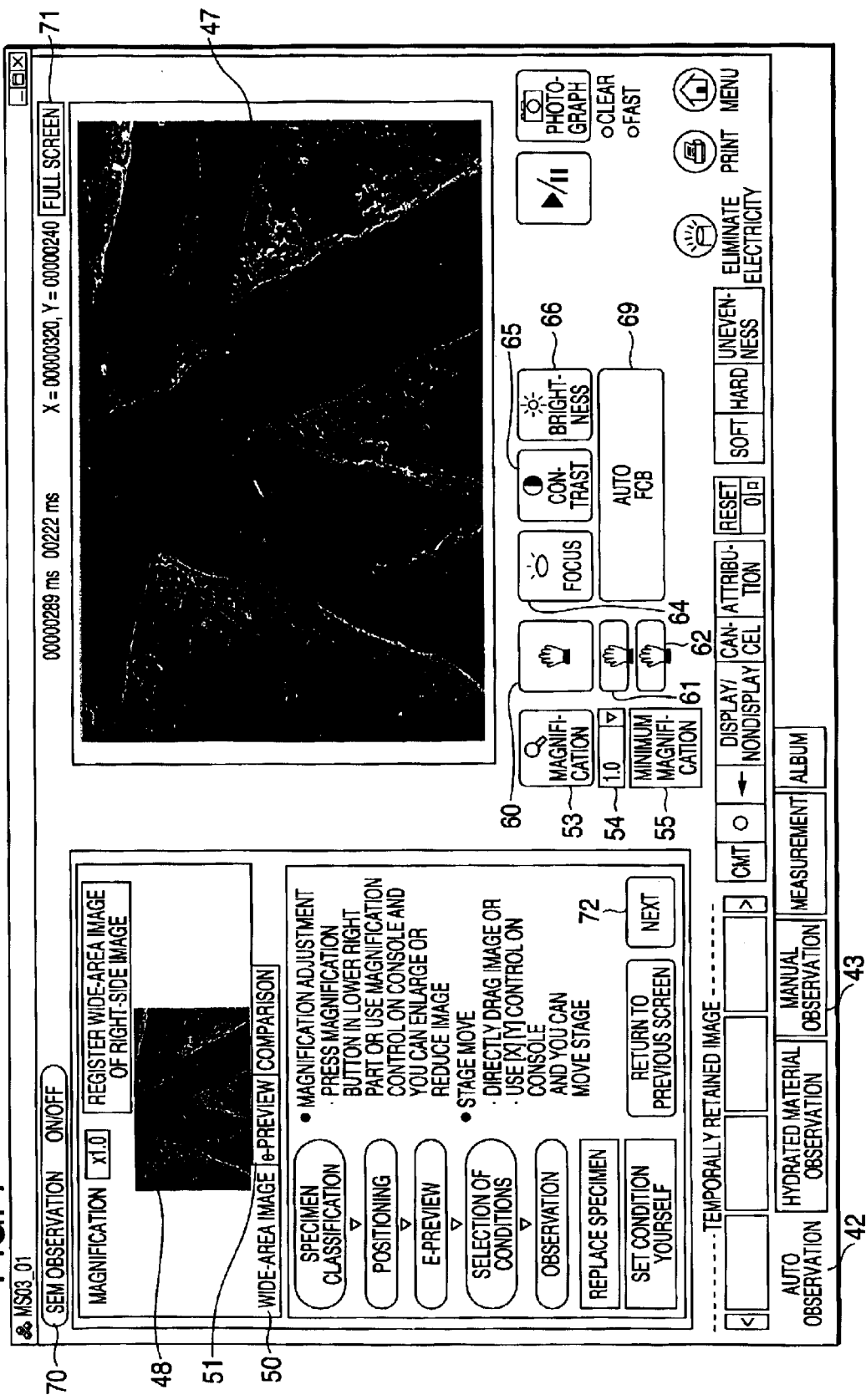
FIG. 7 is an image drawing to show a positioning screen in the auto observation mode in the scanning electron microscope operation program according to the embodiment of the invention.
Figure 8:
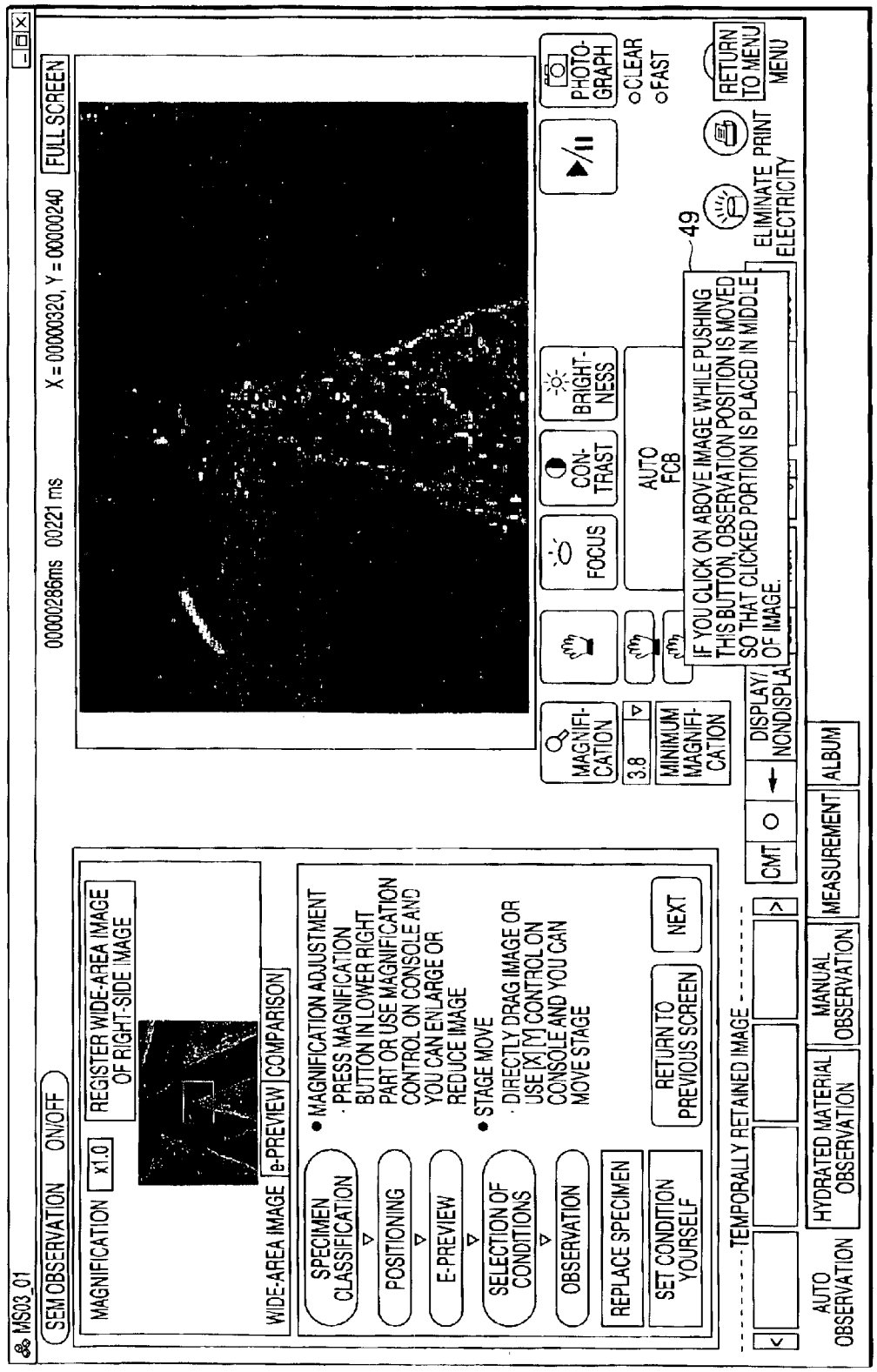
FIG. 8 is an image drawing to show a tool chip function in the scanning electron microscope operation program according to the embodiment of the invention.
Figure 9:
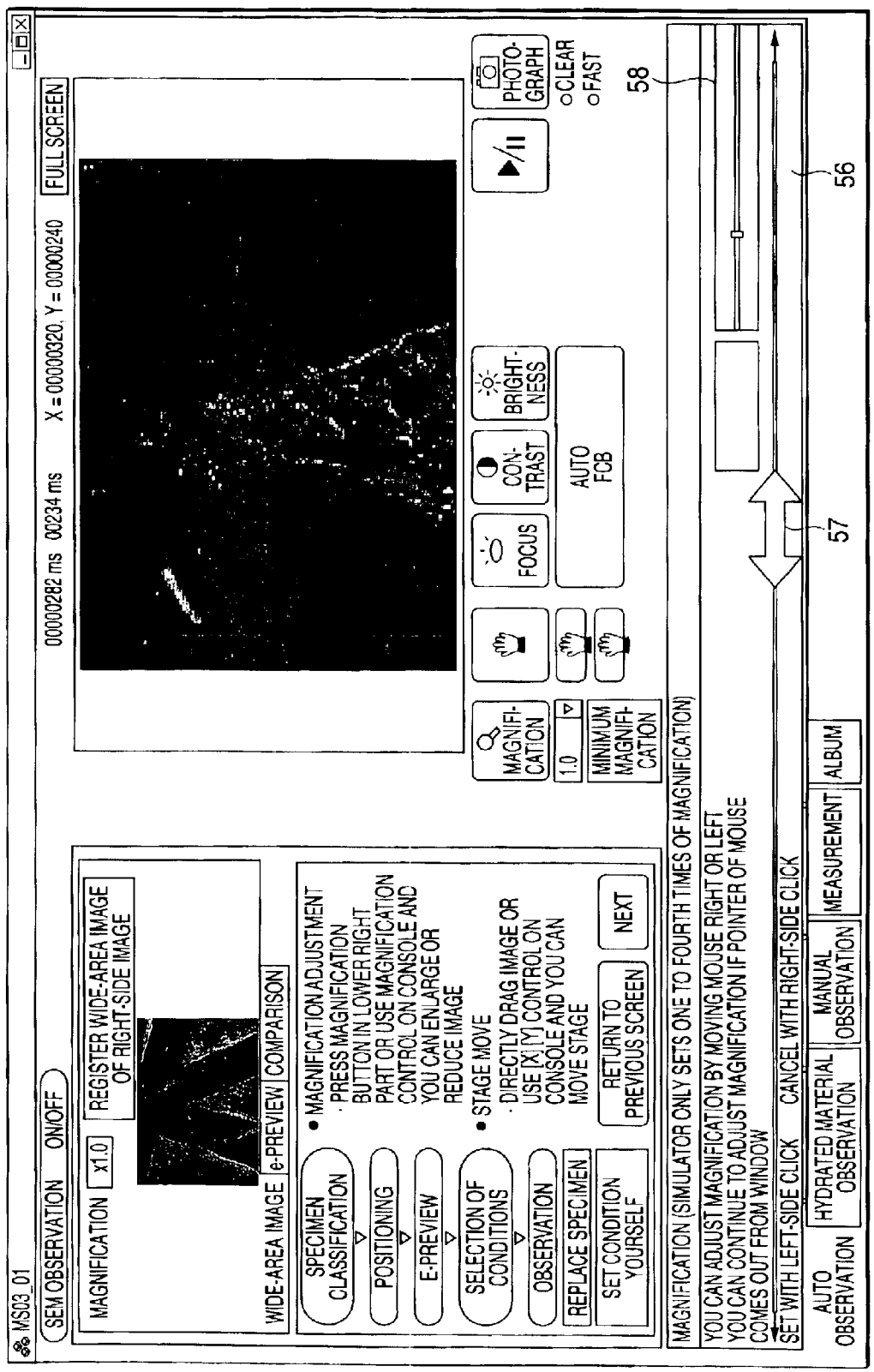
FIG. 9 is an image drawing to show a state in which a first magnification button is operated on the positioning screen in FIG. 7.

FIG. 7 shows a positioning screen for requesting the operator to manually set observation positioning and magnification. The screen in FIG. 7 comprises a first display section 47 to produce main display and a second display section 48 of an auxiliary display section for setting display on the first display section 47. Various setting buttons are placed on the screen. As shown in FIG. 8, a mouse pointer is put on each button, whereby the function description and hint of the button are displayed on a chip screen 49 by a tool chip function. Further, the button or item on which the mouse pointer is put can be highlighted as a frame is displayed or an image of pressing the button is displayed, so that the current item attempted to select can also be clarified.

The display contents of the second display section 48 are switched between a wide-area image 50 and e-preview 51 as a tab is selected. In the example in FIG. 7, for the second display section 48, wide-area image 50 is selected for displaying the whole of an observation image based on the entry and setting in FIG. 6. On the other hand, the first display section 47 displays an image provided by setting and processing the image on the second display section 48. In the example in FIG. 8, a part of the second display section 48 is displayed on an enlarged scale.

[Magnification Adjustment]

The magnification is determined in the first display section 47 in FIG. 7. The operator determines any desired magnification while checking an observation image displayed on the first display section 47. In the example in FIG. 7, the magnification value is a relative value indicating the ratio of the size displayed on the first display section 47 to the size displayed on the second display section 48. For example, when the same image as on the second display section 48 is displayed on the first display section 47, the magnification value becomes 1. However, the display of the magnification is not limited to the example; for example, the magnification may be displayed as an absolute enlargement ratio to the size of the specimen.

To change the magnification, the operator uses a magnification button of magnification adjustment means. In the example in FIG. 7, first to third buttons 53, 54, and 55 are provided. If the operator presses the first magnification button 53 given an icon shaped like a magnifying glass, a screen in FIG. 9 appears and a slider 56 is displayed as a subwindow. As the operator moves an arrow 56 displayed on the slider 56 through input means, the magnification is changed continuously. For example, as the operator moves the slider 56 to the right with the mouse, the image is enlarged; as the operator moves the slider 56 to the left, the image is reduced. Following the specification, the observation image displayed on the first display section 47 is enlarged or reduced in real time. The drawing speed may vary and the image may be displayed with a small delay depending on the operation processing capability of the electron microscope or the computer. At this time, the mouse pointer need not be set onto the slider 56 and the operator can operate the slider 56 simply by moving the mouse to the left or right. A range display section 58 that can be enlarged and reduced is displayed in the upper right corner of the subwindow and indicates what position of the enlargement and reduction range the magnification of the current image being displayed on the first display section 47 is at.

Figure 10:
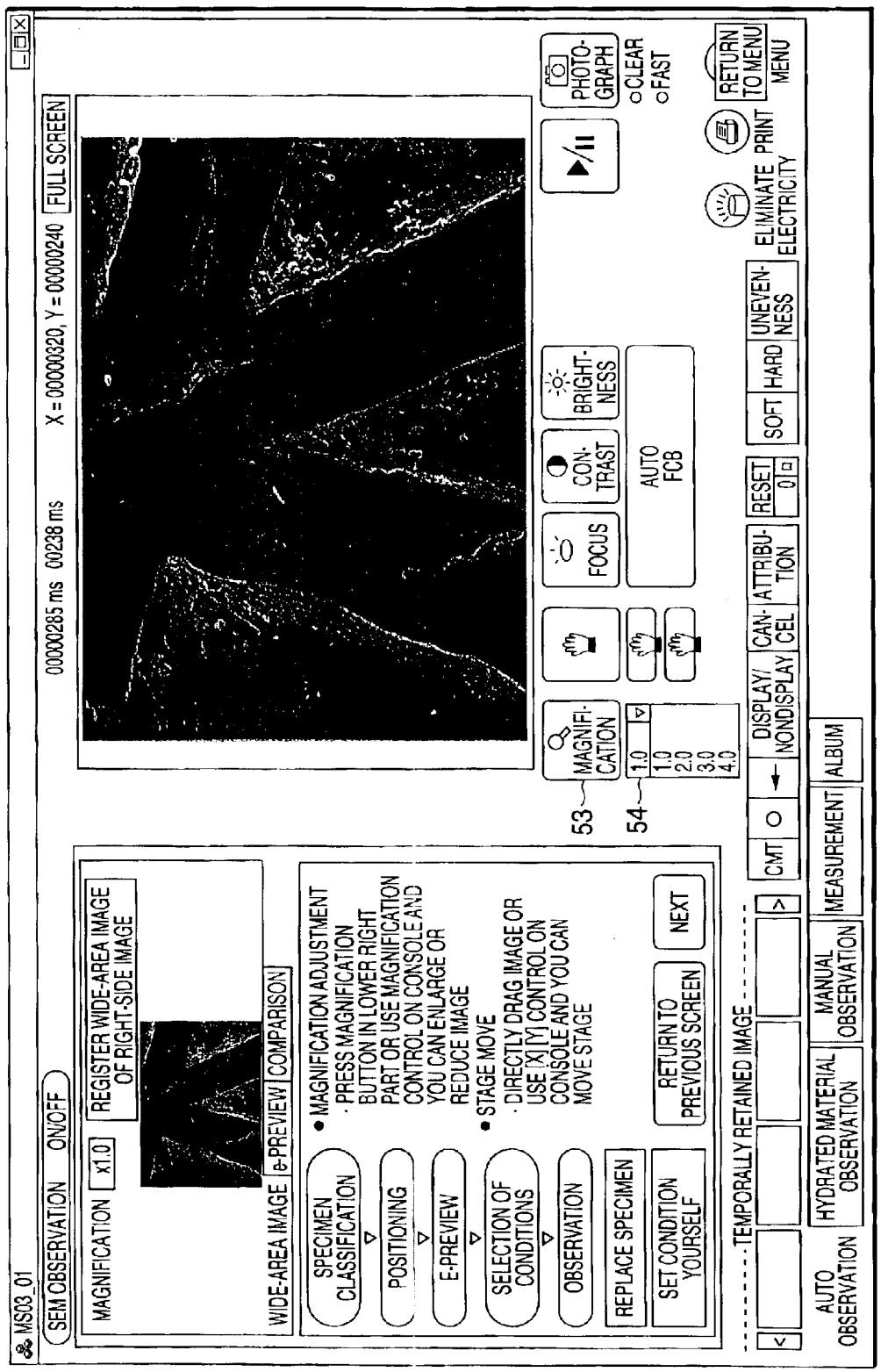
FIG. 10 is an image drawing to show a state in which a drop-down menu is displayed by operating a second magnification button on the positioning screen in FIG. 7.
Figure 11:
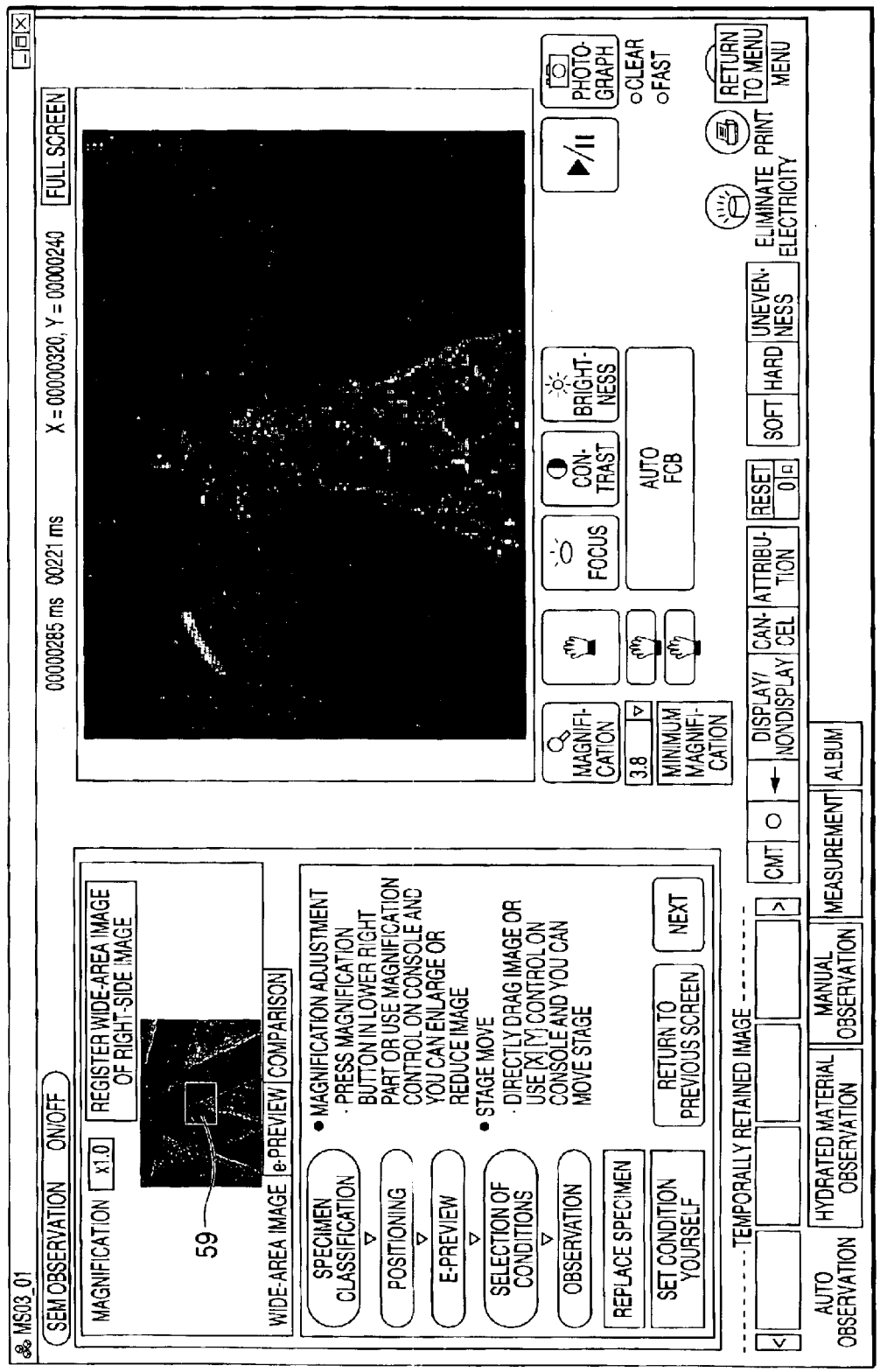
FIG. 11 is an image drawing to show a state in which an enlarged image is displayed on a first display section on the positioning screen in FIG. 7.

The second magnification button 54 displays the magnification in a numeric value. The second magnification button 54 enables the operator to select a predetermined magnification out of a drop-down menu as shown in FIG. 10 or directly enter any desired magnification value in a numeric value. If the operator changes the magnification by operating the first magnification button 53 or the third magnification button 55, the second magnification button 54 also displays the magnification of the current observation image displayed on the first display section 47.

If the operator presses the third magnification button 55, namely, MINIMUM MAGNIFICATION button, a predetermined minimum magnification (for example, 1) is set, whereby immediately the display can be restored to display of the whole image.

If the image is displayed on an enlarged scale on the first display section 47, what part of the image on the second display section 48 is enlarged on the first display section 47 is indicated as the area surrounded by a rectangular frame 59 on the second display section 48. Accordingly, the operator can check what position is displayed at present, and can move to any desired position while checking the second display section 48. In the example in FIG. 7, first to third move buttons 60, 61, and 62 are provided as move buttons each with a palm-shaped icon. If the operator clicks on the first move button 60, the cursor changes like a palm shape on the first display section 47, and the operator can press the left button of the mouse at any desired position and drag, thereby directly grasping the screen and moving. If the operator releases the left button after moving to any desired position, the move mode is released.

The second move button 61 can be used to move with the specified position as the center. If the operator presses the second move button 61, an automatic move is made so that an image with an arbitrary position clicked on the first display section 47 as the center is displayed.

Figure 12:
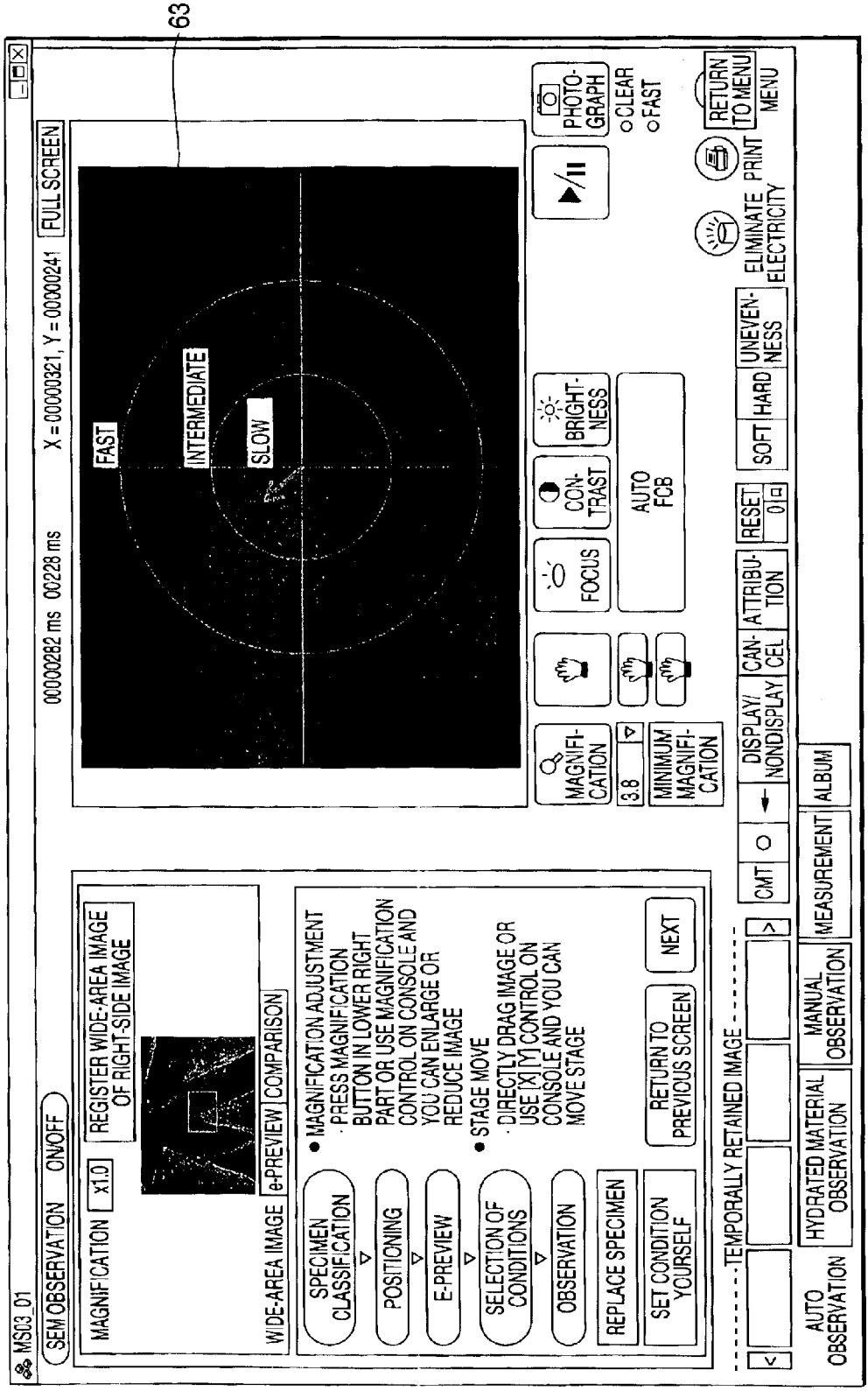
FIG. 12 is an image drawing to show a state in which a third move button is operated on the positioning screen in FIG. 7.
Figure 13:
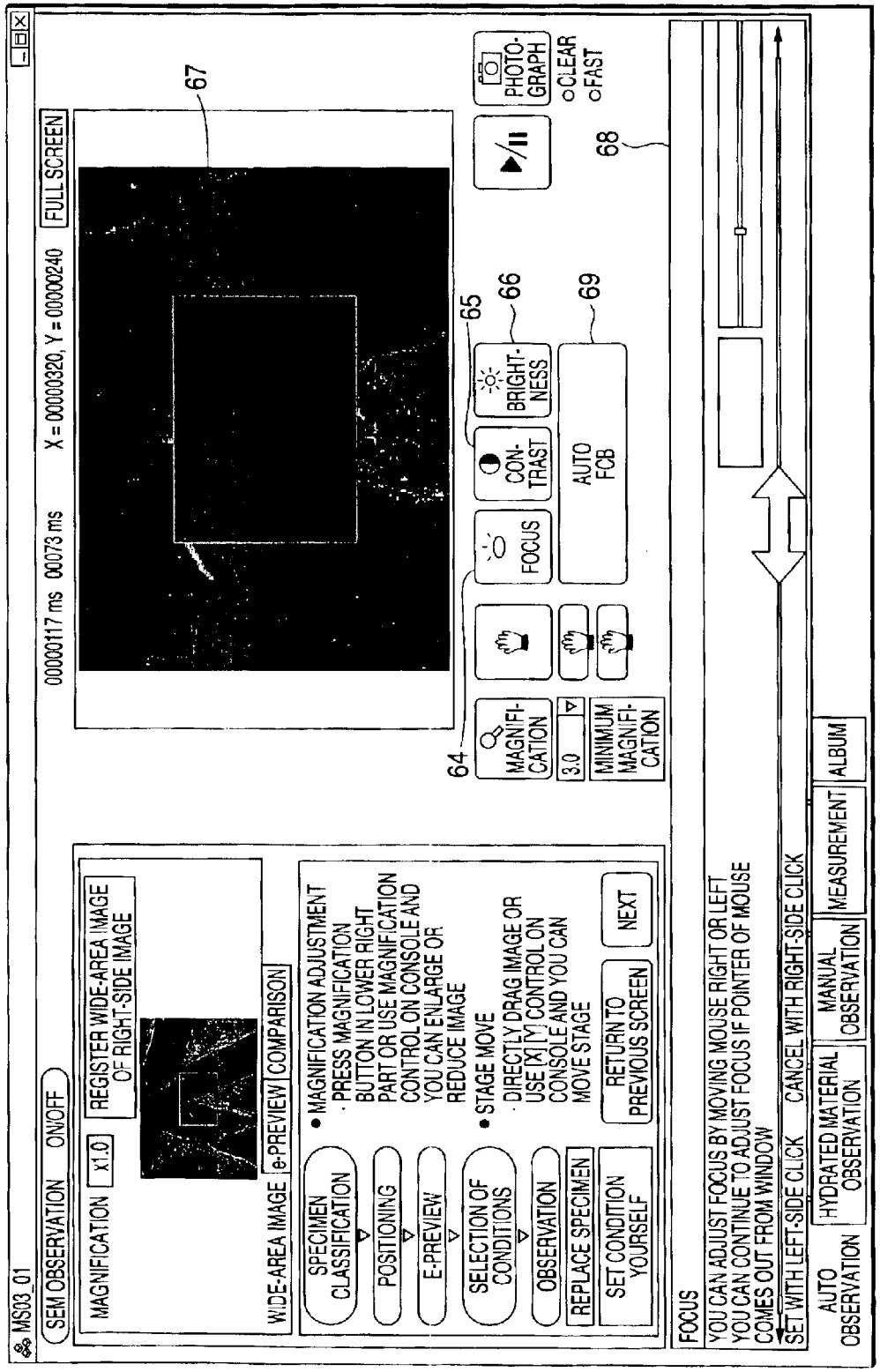
FIG. 13 is an image drawing to show a state in which focus adjustment is made on the positioning screen in FIG. 7.

Further, the third move button 62 enables the operator to specify the screen move direction and move speed. If the operator presses the third move button 62, the cursor changes like a target on the first display section 47. While the operator continues to press the left button in this state, a target-like grid 63 as shown in FIG. 12 is displayed. The target-like grid 63 is displayed almost at the center of the first display section 47, and the screen is moved in the direction in which the mouse pointer, etc., is positioned relative to the center of the target-like grid 63. The move speed changes in accordance with the distance from the center; the nearer to the center, the slower the move and the more distant from the center, the faster the move. Accordingly, the operator can easily operate screen move in any desired direction.

The described observation positioning is performed as the specimen table on which a specimen is placed is moved. As the operator operates the move button, the specimen table is moved in the X direction and the Y direction. However, to move in the display range on the second display section 48, display is possible without moving the specimen table.

To position an observation image and move the observation visual field, the method is not limited to the method of physically moving the specimen table; for example, a method of shifting the scan position of an electron beam applied from the electron gun (image shift) can also be used. Alternatively, both methods can also be used in combination or a method of once inputting image data in a wide range and then processing the data by software can also be used. In this method, the data is once input and is processed and thus the observation position can be moved by software and the method has the advantage that it does not involve hardware move of moving the specimen table or scanning an electron beam. To previously input large image data, for example, a method of acquiring a plurality of pieces of image data at various positions and concatenating the image data, thereby acquiring wide-area image data is available. Alternatively, image data is acquired at low magnification, whereby the, acquired area can be taken large.

[Focus Adjustment]

The operator uses a FOCUS button 64, a CONTRAST button 65, and a BRIGHTNESS button 66 to adjust focus, contrast, and brightness respectively as required. If the operator presses the FOCUS button 64, an area surrounded by a frame 67 is specified on the first display section 47, and a slider 68 is displayed as a subwindow. The operator moves the slider 68 left and right with a mouse, etc., and makes focus adjustment in the area in the frame in a similar manner to that described above. At this time, only the area surrounded by the frame 67 undergoes focus adjustment and the area outside the frame does not change, so that the operator can easily check the focus adjustment effect in comparison. If the operator clicks the right button of the mouse and terminates the focus adjustment, the frame 67 disappears and the focus adjustment is executed in the whole area of the first display section 47. Likewise, the operator can use the CONTRAST button 65 to adjust the contrast with the slider and can use the BRIGHTNESS button 66 to adjust the brightness with the slider.

Further, the focus, the contrast, and the brightness can also be adjusted automatically. If the operator presses an Auto FCB button 69, the optimum condition for the image being displayed on the first display section 47 is computed by image processing, and an automatically adjusted image is displayed on the first display section 47.

Further, a SEM OBSERVATION ON/OFF button 70 indicating that SEM observation is on is displayed in the upper left corner of the screen in FIG. 7. The operator can switch on and off SEM observation by pressing the button 70.

Further, a FULL SCREEN button 71 is provided in the upper right corner of the screen in FIG. 7. As the operator presses the button 71, the whole screen can be used as the area of the first display section 47.

Figure 14:
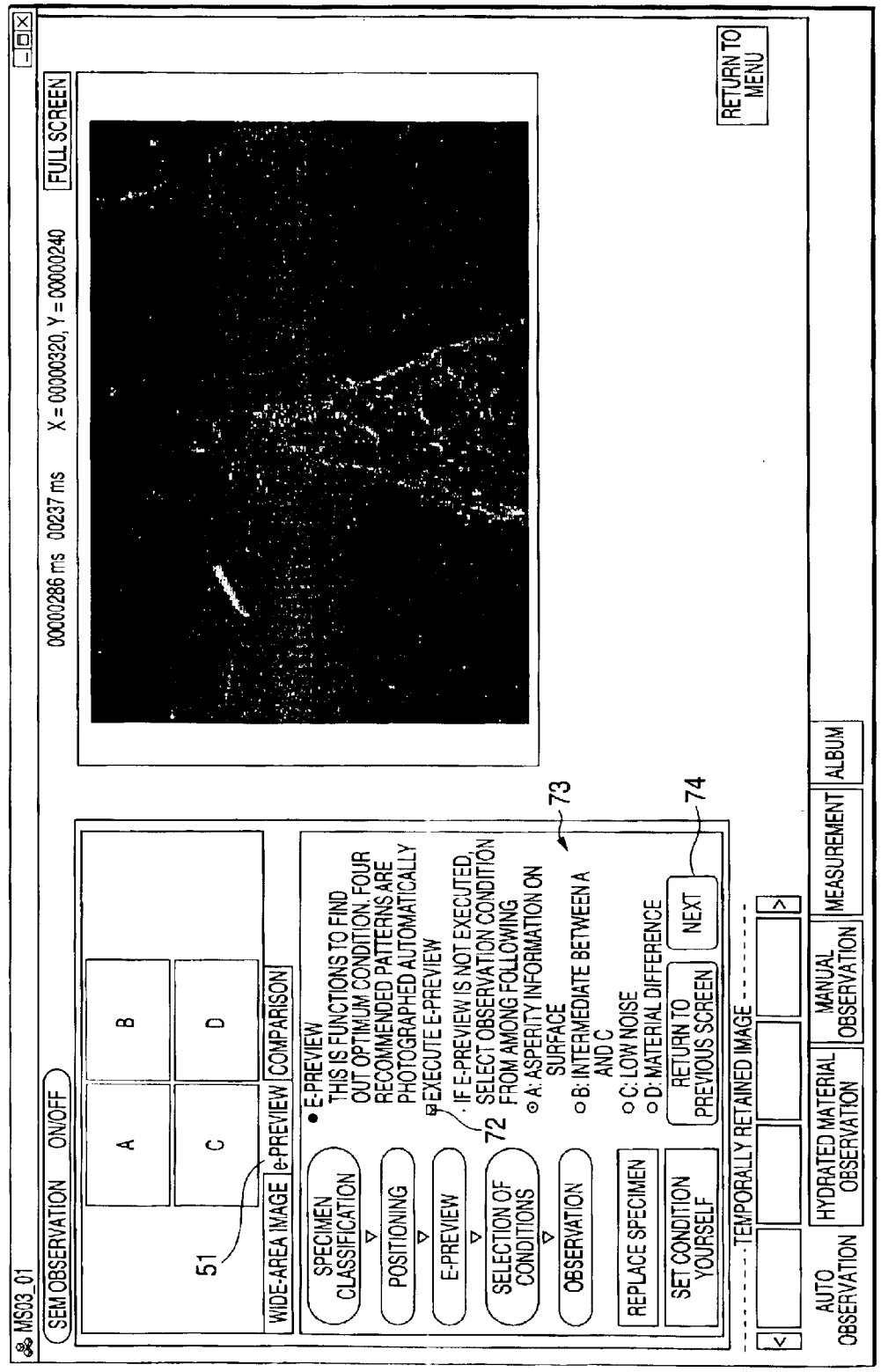
FIG. 14 is an image drawing to show an e-preview screen in the auto observation mode in the scanning electron microscope operation program according to the embodiment of the invention.

If the operator presses a NEXT button 72 after the positioning and magnification adjustment are thus performed, the screen is switched to a screen in FIG. 14.

[Step S3: Select Image Observation Condition]

Figure 15:
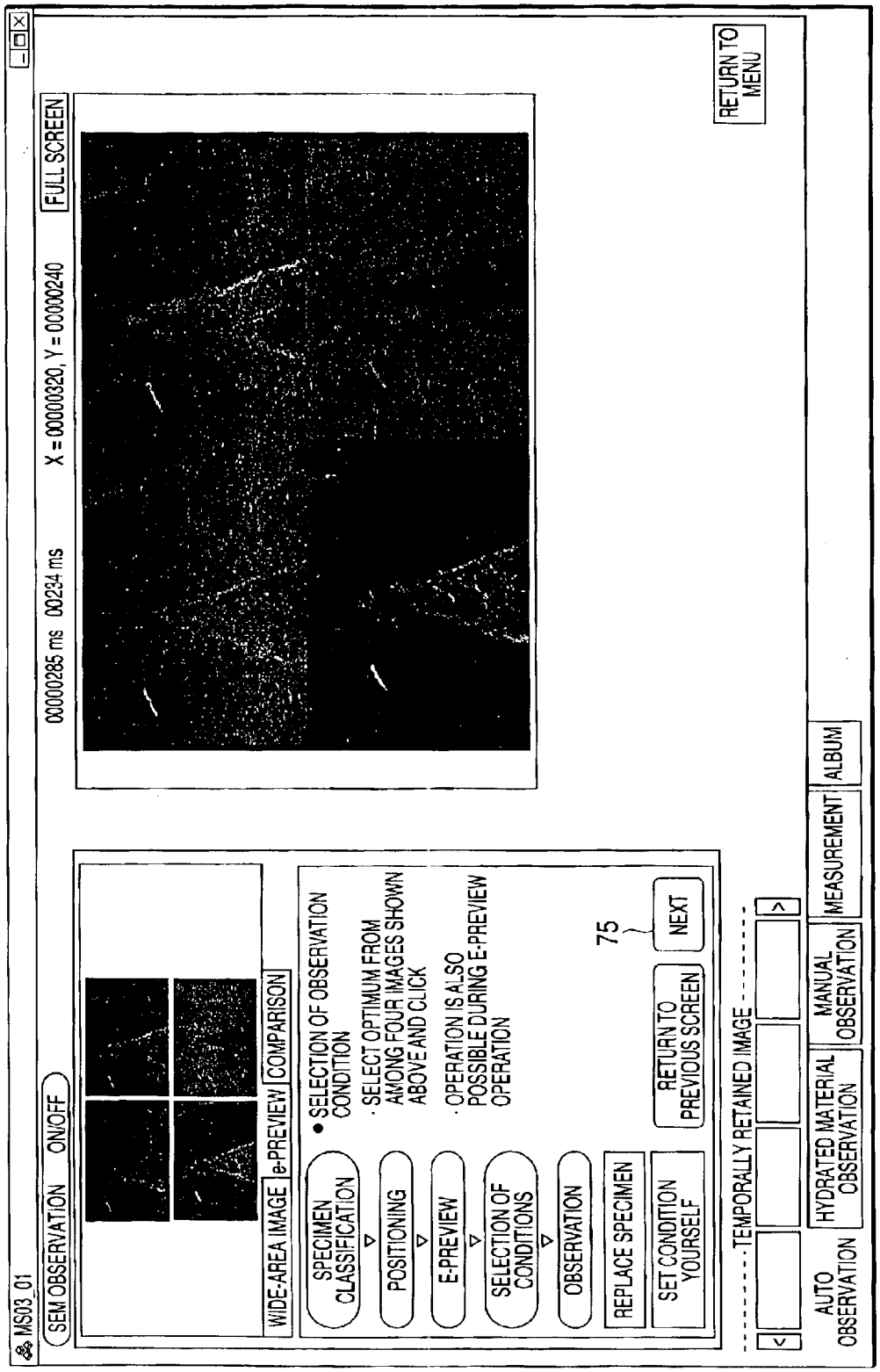
FIG. 15 is an image drawing to show a condition selection screen in the auto observation mode in the scanning electron microscope operation program according to the embodiment of the invention.

On the screen in FIG. 14, the operator selects image observation condition at the observation position and adjustment determined as described above. Here, the operator specifies execution of e-preview for setting a plurality of observation conditions and acquiring a plurality of observation images or selecting only one image observation condition and acquiring one observation image. To execute e-preview, the operator checks a box 72 of EXECUTE E-PREVIEW. FIGS. 14 and 15 show an example of acquiring four simple observation images of A to D and displaying the images on the second display section 48. The observation conditions to acquire the simple observation images A to D are selected from among candidates of observation conditions estimated to be appropriate for the specimen to be observed by the electron microscope or the computer. Particularly, specification as to whether the detector to be used is a secondary electron detector or a reflection electron detector and what value the acceleration voltage is set to become important factors. In the example in FIG. 15, A, B, and C of the simple observation images A to D indicate secondary electron images and D indicates a reflection electron image. However, the combination of the secondary and reflection electron images is not limited to the example; all may be secondary electron images or reflection electron images or one secondary electron image maybe applied with the remainder as reflection electron images. Which detector is to be used is specified appropriately in response to the image observation condition, the purpose of image observation, the operator's intention, etc.

In the example in FIG. 14, the observation condition for the simple observation image A is set with a view to acquiring fine asperity information on the surface of the specimen, the observation condition for the simple observation image C is set with a view to observing the specimen with noise suppressed, and the observation condition for the simple observation image B is set as an intermediate condition between A and C. The observation condition for the simple observation image D is set with a view to determining the specimen material difference.

The specimen is observed with the observation condition changed in the direction of increasing the acceleration voltage to avoid charge up. To acquire the simple observation images in the order of A to D, the acceleration voltage becomes higher from A to D. After detection with secondary electron detector, observation is conducted with reflection electron detector. For example, reflection electron detector is used as the simple observation image D.

Figure 16:
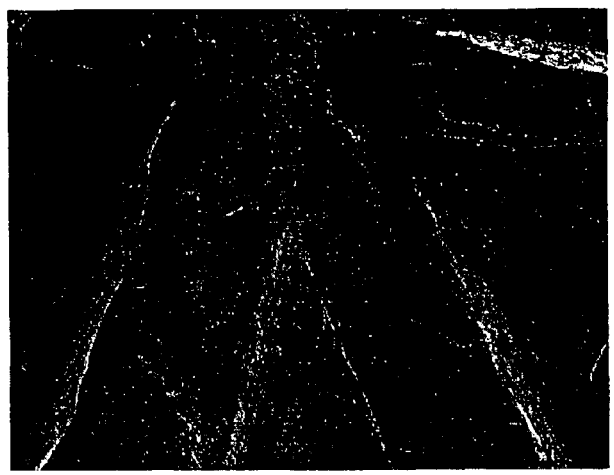
FIG. 16 is an image drawing of observing one-yen coin at magnification of 100 at acceleration voltage 2 kV using secondary electron detector.
Figure 17:
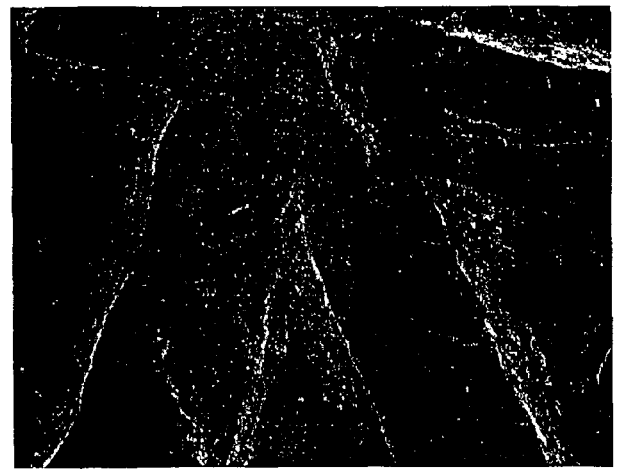
FIG. 17 is an image drawing of observing one-yen coin at magnification of 100 at acceleration voltage 5 kV using secondary electron detector.
Figure 18:
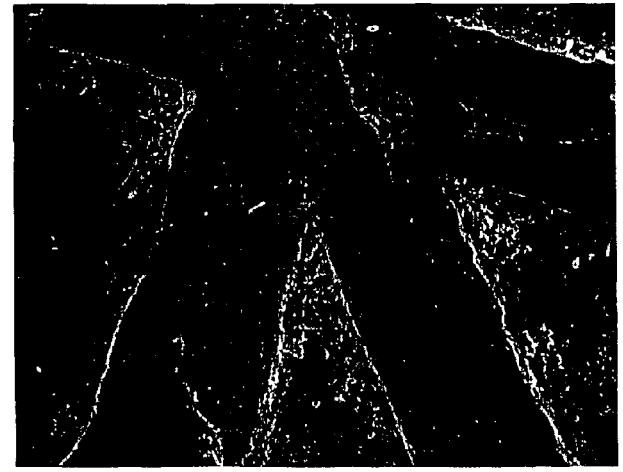
FIG. 18 is an image drawing of observing one-yen coin at magnification of 100 at acceleration voltage 20 kV using secondary electron detector.
Figure 19:
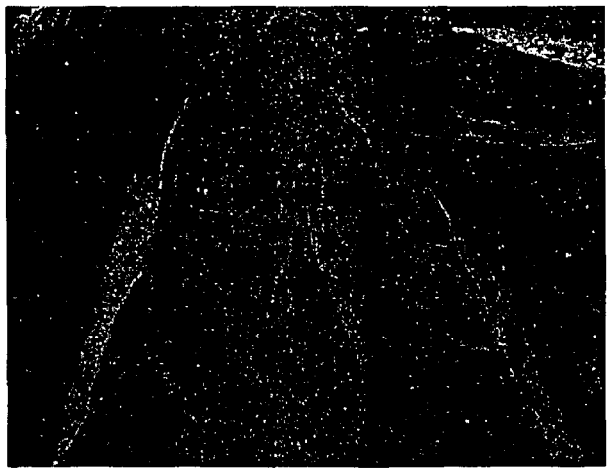
FIG. 19 is an image drawing of observing one-yen coin at magnification of 100 at acceleration voltage 20 kV using reflection electron detector.

FIGS. 16 to 23 show examples of e-preview. FIGS. 16 to 19 show examples of measurement on a one-yen coin as a specimen at magnification of 100, and FIGS. 20 to 23 show examples of measurement on the cross section of a through hole made in a glass epoxy board at magnification of 500. FIG. 16 shows an example of observation at acceleration voltage 2 kV using secondary electron detector; it is seen that up to fine asperities on the surface of the specimen can be observed. FIG. 17 shows an example of observation at acceleration voltage 5 kv with secondary electron detector, and FIG. 18 shows an example of observation at acceleration voltage 20 kV with secondary electron detector. Particularly, in FIG. 18, the asperities of the specimen can be observed through thin oil content on the surface. If the secondary electron detector is thus used as the detector, the asperities on the surface can be observed. Further, FIG. 19 shows an example of observation at acceleration voltage 20 kV with reflection electron detector; the difference between compositions of garbage accumulated in gaps of aluminum can be checked. Thus, the composition of the specimen rather than asperities on the surface is made clear with the reflection electron detector.

Figure 20:
FIG. 20 is an image drawing of observing the cross section of glass epoxy board at magnification of 500 at acceleration voltage 0.8 kV using secondary electron detector.
Figure 21:
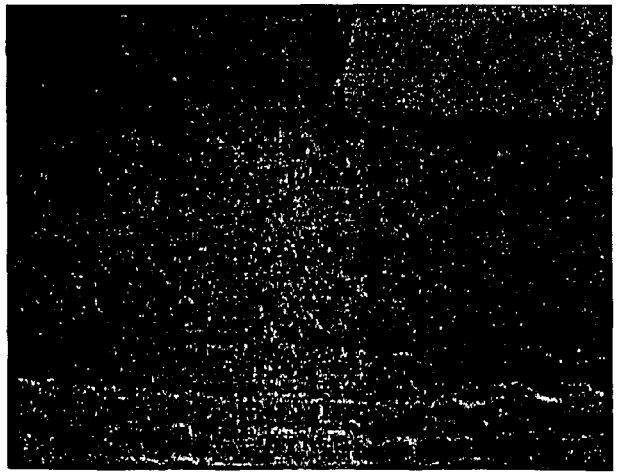
FIG. 21 is an image drawing of observing the cross section of glass epoxy board at magnification of 500 at acceleration voltage 1.2 kV using secondary electron detector.
Figure 22:
FIG. 22 is an image drawing of observing the cross section of glass epoxy board at magnification of 500 at acceleration voltage 1.6 kV using secondary electron detector.
Figure 23:
FIG. 23 is an image drawing of observing the cross section of glass epoxy board at magnification of 500 at acceleration voltage 2.0 kV using secondary electron detector.
Figure 24:
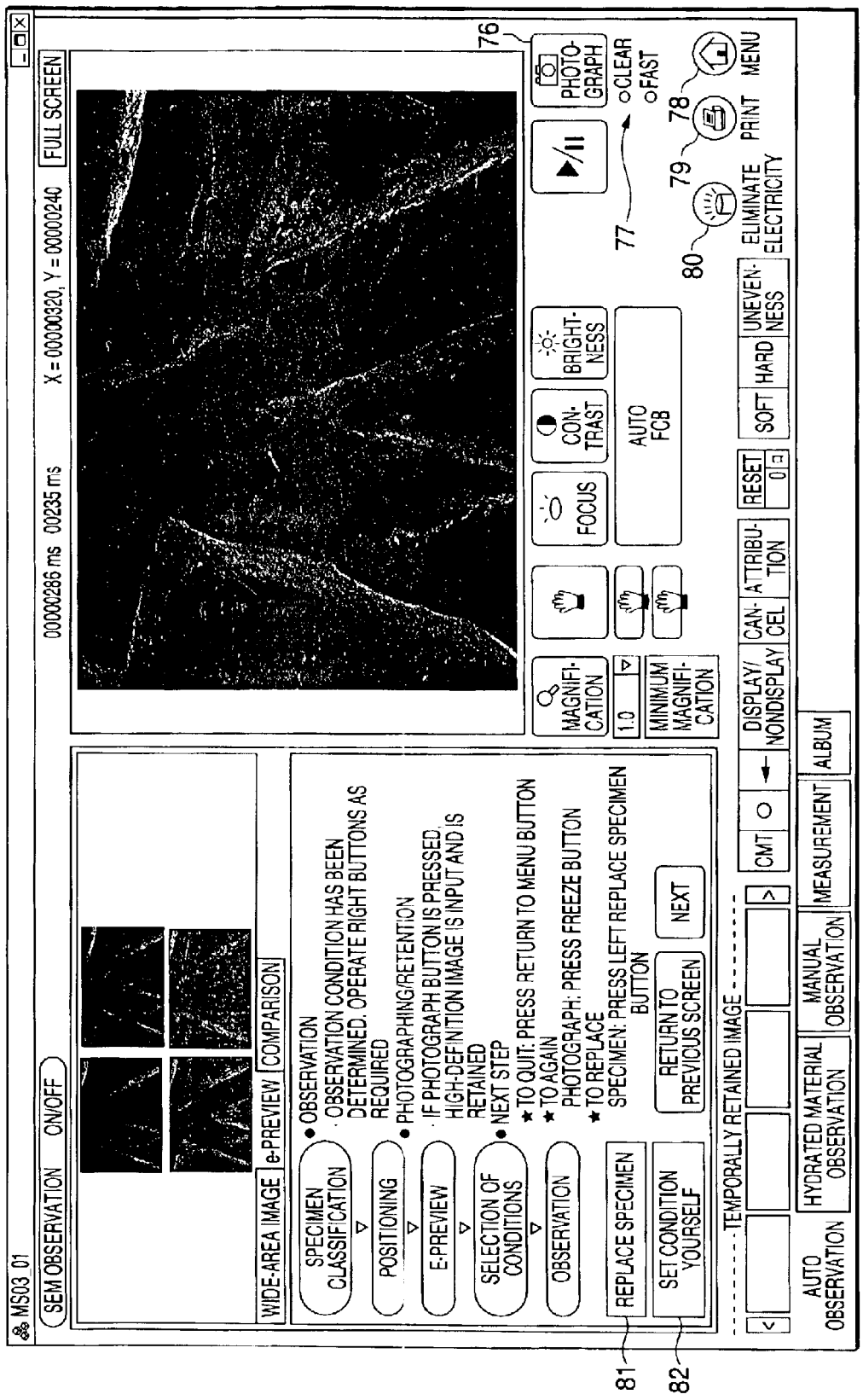
FIG. 24 is an image drawing to show an observation screen in the auto observation mode in the scanning electron microscope operation program according to the embodiment of the invention.

FIGS. 20 to 23 show examples of observation while acceleration voltage is raised using secondary electron detector; the acceleration voltage in FIG. 20 is 0.8 kV, that in FIG. 21 is 1.2 kV, that in FIG. 22 is 1.6 kV, and that in FIG. 23 is 2.0 kV. It can be recognized in the figures that as the acceleration voltage is raised, charge-up occurs and image formation is disordered.

However, the settings are shown by way of example, and can be changed appropriately in response to the specimen and the observation purpose, needless to say. For example, all are observed with secondary electron detector, observation with reflection electron detector is increased, or the number of simple observation images is increased or decreased.

On the other hand, if e-preview is not executed, the operator selects any desired image observation condition out of an image observation condition selection field 73. As options in the image observation condition selection field 73, a combination of observation conditions which seems to be optimum is automatically computed and presented by the electron microscope or the computer. Here, the options in the image observation condition selection field 73 correspond to the simple observation images A, to D in e-preview described above. If the operator selects any desired observation condition and presses a NEXT button 74, one simple observation image formed under the selected observation condition is displayed on the second display section 48. In this case, only one image is drawn and thus preview requires a short time. This can be used when the observation condition to be selected is determined, for example, when a similar specimen was observed and the same condition as the observation condition applied at the previous observation time is set, when an already observed specimen is again to be observed, etc.

If the operator checks the box 72 of EXECUTE E-PREVIEW, the image observation condition selection field 73 is grayed out and becomes unselectable. Thus, it is made impossible to select an unnecessary item, so that malfunction can be prevented.
[Condition Selection]

If the operator checks the box 72 of EXECUTE E-PREVIEW and presses the NEXT button 74, the screen changes to a condition selection screen in FIG. 15 and the e-preview operation is started. At this time, the second display section 48 is switched to E-PREVIEW 51 for displaying a plurality of simple observation images. As the e-preview operation is performed, simple observation images are drawn in order. It takes several seconds to several ten seconds in drawing each simple observation image. As each simple observation image, a distinctive observation image is displayed in response to the corresponding observation condition. The operator selects any desired image from among the simple observation images displayed on the second display section 48.

In the example in FIG. 15, the four simple observation images A, B, C, and D are displayed. If the operator superposes the mouse pointer on each preview screen, a description is chip-displayed. For example, the numbers and the features of the simple observation images, the acceleration voltage, and the like are displayed in such a manner that "A: Easy on specimen although resolution is low (acceleration voltage 2 kV)," "B: Intermediate between A and C (acceleration voltage 5 kV)," "C: Hard on specimen although resolution is high (acceleration voltage 20 kV)," and "D: Material difference is easy to understand (acceleration voltage 20 kV)."

If the operator clicks on any simple observation image for selection, the selected observation image is displayed on the first display section 47, so that the operator can check the observation image in more detail as an enlarged image. If the operator thus selects any desired simple observation image and then presses a NEXT button 75, the screen advances to an observation screen in FIG. 24.

The e-preview operation takes a time to some extent until display of all simple observation images is complete. Thus, when any desired simple observation image is displayed, if other simple observation images are not yet displayed, the operator can select the desired simple observation image and advance to the next step or can select even a simple observation image not yet displayed. For example, when the operator has already observed the same or similar specimen and knows or can predict the optimum condition, if the operator immediately specifies the number of any of A to D without checking the simple observation images displayed in e-preview, the specified simple observation image is set in the SEM as the observation condition. The functions make it possible to drastically shorten the time required for setting.

As for astigmatism correction, automatic adjustment may not well function and if the automatic adjustment results in failure and a simple observation image cannot be acquired, it is made impossible to make a comparison with any other simple observation image. Thus, a method of skipping astigmatism correction can be used. For example, the initial value of astigmatism is used or astigmatism is fixed to a predetermined value which seems to be appropriate, or to skip astigmatism correction, the values of astigmatism are preset in a table in response to other image observation conditions, such as the detector type, the acceleration voltage, and the spot size, and the appropriate astigmatism value is set by referencing the table. Alternatively, the magnification is limited, for example, to 10000 times at the maximum, whereby the fear of occurrence of astigmatism can be avoided.
[Step S4: Pick Up Image and Perform any Desired Operation]

An observation image is displayed on the first display section 47 based on the simple observation image condition thus selected. Additional adjustment can be made to the acquired observation image. The adjustable items include magnification, positioning, focus adjustment, contrast adjustment, brightness adjustment, and the like similar to those described above.

When the desired observation image is acquired, further any desired operation is performed for the acquired image. For example, image photographing, retention, print, dimension measurement, etc., can be performed. If the operator presses a PHOTOGRAPH button 76 on the screen in FIG. 24, the observation image being displayed is input and the image data is retained on a medium such as a hard disk of the computer as a digital signal. A radio button 77 for selecting either CLEAR or FAST is provided below the PHOTOGRAPH button 76. If CLEAR is selected, the observation image is retained as image data in higher definition. The term "CLEAR" mentioned here is used to mean that it takes time in scanning the electron beam applied to the specimen (for example, 60 seconds) for inputting a signal good in S/N ratio of secondary electrons or reflection electrons. The term "FAST" mentioned here is used to mean that it takes short time in scanning the electron beam applied to the specimen (for example, 30 seconds) for inputting a signal with the processing time given a high priority accordingly. If FAST is selected, the precision of the image data is a little degraded, but the image data can be retained at higher speed. As the number of pixels of the image data to be retained, any desired size of 640×480 pixels, 1280×960 pixels, 512×512 pixels, 1024×1024 pixels, 2048×2048 pixels, etc., can be used in response to the use purpose.

Further, the next operation is selected as required. If the operator again presses the PHOTOGRAPH button 76, photographing can be again conducted. If the operator presses a RETURN TO MENU button 78 provided in the lower right corner of the screen in FIG. 24, the screen returns to the menu screen in FIG. 2. A PRINT button 79 is placed at the left of the RETURN TO MENU button 78 and enables the operator to print on the printer 29 connected to the computer 1 or the electron microscope. An ELIMINATE ELECTRICITY button 80 is placed at the left of the PRINT button 79 and enables electricity to be eliminated in a state in which the specimen is charged up.

[Replace Specimen]

To replace the specimen and conduct image observation, the operator presses a REPLACE SPECIMEN button 81 placed at the left of the screen. The guidance procedure is again started from the beginning.

[Set Condition Yourself]

Figure 25:
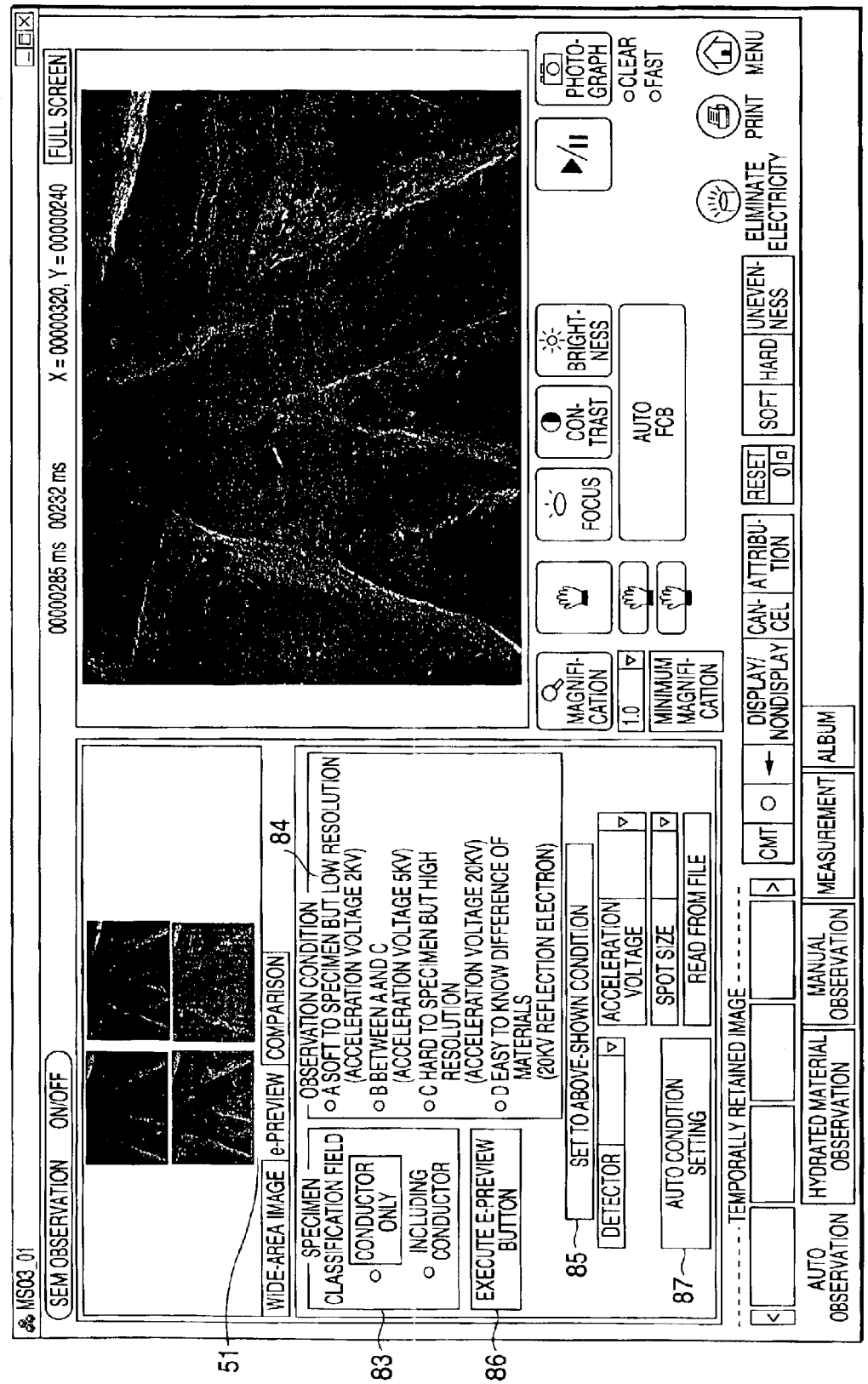
FIG. 25 is an image drawing to show a SET CONDITION YOURSELF screen in the auto observation mode in the scanning electron microscope operation program according to the embodiment of the invention.

The guide of the guidance function can also be stopped in the auto observation mode. If the operator presses a SET CONDITION YOURSELF button 82, a screen in FIG. 25 is displayed and enables the operator to enter all setup items entered according to the guidance function. Accordingly, the operator can specify any desired setup item regardless of the setting order presented by the guidance function. The SET CONDITION YOURSELF button 82 can be used, for example, when the operator who can grasp the operation procedure as a result of using the auto observation mode several times wants to set the image observation condition on one screen. Also in this case, an observation image can be provided as the operator enters only predetermined items without setting all image observation conditions manually; convenient use can be made.

Specifically, the operator uses a radio button to specify whether the specimen is conductor only or contains an insulator in a SPECIMEN CLASSIFICATION field 83. The operator uses a radio button to select any desired image observation condition from among various image observation conditions in an OBSERVATION CONDITION field 84. If the operator presses a SET TO ABOVE-SHOWN CONDITION button 85 after selecting the image observation condition, the detector, the acceleration voltage, and the spot size responsive to the image observation condition are automatically entered in corresponding condition fields. Each condition field is provided with a drop-down menu and the operator can also select any desired one out of displayed options. Further, if the operator presses an EXECUTE E-PREVIEW button 86, e-preview is started, the tab on the second display section 48 is switched to E-PREVIEW 51, and simple observation images in e-preview are drawn in order and are displayed. If the operator selects any desired simple observation image, the selected image is displayed on the first display section 47.

If the operator wants to use guidance-type observation condition setting according to the guidance function, the operator presses an AUTO CONDITION SETTING button 87. The screen returns to the screen in FIG. 6.

[Retain and Call Image Observation Condition]

The image observation condition can be retained and the retained image observation condition can be later read for use. The recommended image observation conditions of the acceleration voltage, the spot size, the magnification, etc., can also be preset in response to various specimens and observation purposes in the electron microscope or the computer, and can also be called. The operator can call appropriate setting in response to the situation and can change or adjust the setting as required for use.

Figure 26:
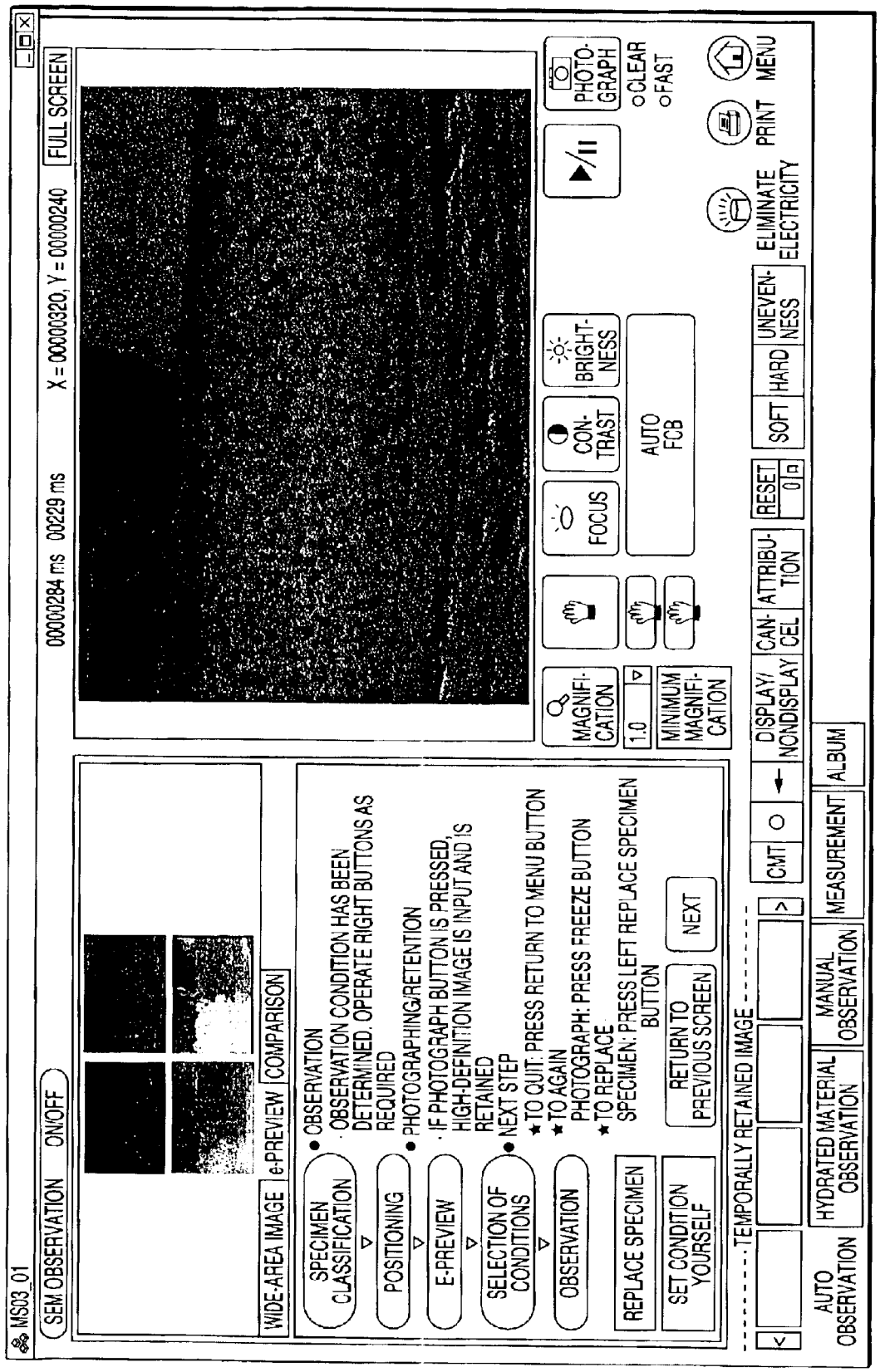
FIG. 26 is an image drawing to show an example of execution of e-preview in observing the glass epoxy board in FIGS. 20 to 23 in the auto observation mode in the scanning electron microscope operation program according to the embodiment of the invention.

In the example, a one-yen coin is used as the specimen and three secondary electron images and one reflection electron image are displayed as the simple observation images. In contrast, FIG. 26 shows an example of execution of e-preview in observing the glass epoxy board in FIGS. 20 to 23 as the specimen according to a similar procedure to that described above. In FIG. 26, secondary electron images are displayed as all simple observation images. Thus, as the simple observation images displayed in the second display section 48, secondary and reflection electron images are displayed in combination and in addition, only secondary electron images or only reflection electron images can also be displayed.

In the embodiment, the example of picking up four simple observation images by executing e-preview has been described, but the number of simple observation images to be picked up may be two or three or can also be five or more. How many simple observation images are to be displayed is determined in response to the time required for drawing each simple observation image, the image observation condition, etc.

[Advantages of the Invention]

As described above, according to the electron microscope, the electron microscope operation method, the electron microscope operation program, and the computer-readable medium of the invention, an optimum image observation condition can be found out easily, because the electron microscope, the electron microscope operation method, the electron microscope operation program, and the computer-readable medium of the invention automatically acquire a plurality of observation images according to a predetermined condition, display the observation images, and request the operator to select any desired image from among the displayed observation images, whereby preferred image observation condition can be set easily. Particularly, image observation condition can be selected without specifying complicated setting and thus operation is extremely easy and the images acquired under the conditions can be compared with each ether for selection, so that even the operator who has poor experience in operating an electron microscope can operate the electron microscope based on the images displayed on the screen and can acquire the optimum image observation condition. Since an observation image can be simply acquired for shortening the display time, the observation image acquired under the changed condition can be displayed smoothly and the relationship between the image observation condition and the observation image can be grasped easily. Thus, the extremely excellent advantage that the operator familiar with operation of an electron microscope can also check condition change and set to any desired condition can be provided. E-preview can also be executed more than once for narrowing down, again setting, etc., conditions, and tuning work to more detailed condition is also facilitated.

What is claimed is:

1. An electron microscope for picking up an observation image of a specimen based on an image observation condition, the electron microscope comprising:

an image observation condition setting section for setting a plurality of different image observation conditions for a predetermined observation image picked up under a predetermined image observation condition;

an observation image acquisition section for picking up a plurality of observation images based on the plurality of image observation conditions set through said image observation condition setting section;

a second display section for simultaneously displaying the plurality of observation images picked up by said observation image acquisition section;

an observation image selection section for selecting a desired observation image from among the observation images displayed on said second display section; and a first display section for displaying on an enlarged scale the observation image selected through said observation image selection section.

2. The electron microscope as claimed in claim 1, wherein said image observation condition setting section automatically sets a plurality of acceleration voltage conditions with at least an acceleration voltage changed as the different image observation conditions.

3. The electron microscope as claimed in claim 2, wherein the observation image acquisition section picks up the observation images in the ascending order of the acceleration voltages.

4. The electron microscope as claimed in claim 1, wherein said image observation condition setting section automatically makes a detector selection as the different image observation conditions.

5. The electron microscope as claimed in claim 1, wherein the observation images displayed on said second display section include a plurality of secondary electron images.

6. The electron microscope as claimed in claim 1, wherein the observation images displayed on said second display section include a plurality of reflection electron images.

7. The electron microscope as claimed in claim 1, wherein the observation images displayed on said second display section include at least one secondary electron image and at least one reflection electron image.

8. The electron microscope as claimed in claim 7, wherein the observation images acquisition section picks up the observation images in the order as each secondary electron image is picked up and then each reflection electron image is picked up.

9. The electron microscope as claimed in claim 1, further comprising:

an adjustment section for adjusting the observation image selected through said observation image selection section with respect to at least any of focus, brightness, or contrast.

10. The electron microscope as claimed in claim 1, further comprising:

a retention section for retaining the image observation conditions corresponding to the observation images displayed on said second display section.

11. The electron microscope as claimed in claim 10, wherein the image observation condition setting section calls the retained image observation conditions from the retention section to set the different image observation conditions, and the image observation acquisition section picks up a plurality of observation images based on the called image observation conditions.

12. The electron microscope as claimed in claim 1, wherein the image observation condition setting section sets a plurality of new image observation conditions based on the image observation condition of the observation image selected by the observation image selection section, and the image observation acquisition section picks up a plurality of observation images based on the setup new image observation conditions.

13. A method for operating an electron microscope which picks up an observation image of a specimen based on an image observation condition, the method comprising:

setting a plurality of different image observation conditions for a predetermined observation image picked up under a predetermined image observation condition;

picking up a plurality of observation images based on the setup image observation conditions;

simultaneously displaying the plurality of picked-up observation images on a second display section;

selecting a desired observation image from among the observation images displayed on the second display section; and displaying the selected observation image on a first display section on an enlarged scale.

14. The electron microscope operation method as claimed in claim 13, further comprising:

manually setting at least a spot size of an electron beam on the specimen, an acceleration voltage, a detector type, a specimen position, and an observation magnification as the predetermined image observation condition, and picking up an observation image based on the setup image observation condition as the predetermined observation image, wherein the plurality of different image observation conditions are automatically set based on the predetermined observation image.

15. The electron microscope operation method as claimed in claim 13, wherein the observation images displayed on the second display section include one or more secondary electron images or one or more reflection electron images.

16. The electron microscope operation method as claimed in claim 13, further comprising:

retaining a history of the image observation conditions, wherein the history is called and a desired image observation condition is selected out of the history, whereby image picking up can be performed under the same image observation condition as the selected image observation condition.

17. The electron microscope operation method as claimed in claim 16, wherein a plurality of image observation conditions are selected from among the retained image observation conditions and based on the selected image observation conditions, a plurality of observation images are picked up and can be displayed on the second display section.

18. A method for operating an electron microscope which picks up an observation image of a specimen based on an image observation condition, the method comprising:

setting a plurality of different image observation conditions for a predetermined observation image picked up under a predetermined image observation condition;

simply picking up a plurality of observation images based on the setup image observation conditions;

simultaneously displaying the plurality of picked-up simple observation images on a second display section;

selecting a desired simple observation image from among the simple observation images displayed on the second display section; and performing an usual image picking-up based on the image observation condition corresponding to the selected simple observation image.

19. The electron microscope operation method as claimed in claim 18, further comprising:

setting one or more simple image observation conditions with at least the acceleration voltage or the detector changed as new simple image observation condition for the selected simple observation image, after selecting a desired simple observation image from among the simple observation images displayed on the second display section;

displaying one or more simple observation images simply picked up based on the one or more new simple image observation conditions on the second display section;

selecting a desired simple observation image from among the one or more simple observation images displayed on the second display section; and displaying the selected simple observation image on a first display section.

20. A method for operating an electron microscope which picks up an observation image of a specimen based on an image observation condition, the method comprising:

specifying at least characteristics of a specimen as setup items of a predetermined image observation condition;

setting the predetermined image observation condition based the specified characteristics of the specimen;

simply picking up an observation image under the predetermined image observation condition and displaying the picked-up simple observation image on a first display section, setting one or more simple image observation conditions with at least an acceleration voltage or a detector changed for the simple observation image displayed on the first display section displaying one or more simple observation images simply picked up based on the one or more simple image observation conditions on a second display section;

selecting a desired simple observation image from among the one or more simple observation images displayed on the second display section; and performing an usual image picking-up based on the simple image observation condition corresponding to the selected simple observation image and displaying the picked-up image on the first display section.

21. The electron microscope operation method as claimed in claim 20, further comprising:

making at least magnification adjustment and position adjustment to the simple observation image displayed on the first display section, before setting the one or more simple image observation conditions, wherein the one or more simple image observation conditions are set for the simple observation image adjusted in at least magnification and position.

22. The electron microscope operation method as claimed in claim 20, further comprising:

making at least magnification adjustment and position adjustment to the selected simple observation image, before performing the usual image picking-up, wherein the usual image picking-up is performed based on the simple image observation condition corresponding to the selected simple observation image at adjusted magnification and position.

23. The electron microscope operation method as claimed in claim 20, further comprising:

setting one or more simple image observation conditions with at least the acceleration voltage or the detector changed as new simple image observation condition for the selected simple observation image, after selecting a desired simple observation image from among the one or more simple observation images displayed on the second display section;

displaying one or more simple observation images simply picked up based on the one or more new simple image observation conditions on the second display section;

selecting a desired simple observation image from among the one or more simple observation images displayed on the second display section; and displaying the selected simple observation image on the first display section.

24. A method for operating an electron microscope which picks up an observation image of a specimen based on an image observation condition, the method comprising:

manually setting at least a spot size of an electron beam on the specimen, an acceleration voltage, a detector type, a specimen position, and an observation magnification as setup items of a predetermined image observation condition;

picking up an observation image under the predetermined image observation condition and displaying the picked-up observation image on a first display section;

making at least magnification adjustment and position adjustment to the observation image displayed on the first display section;

setting one or more simple image observation conditions with at least the acceleration voltage or the detector changed for the observation image displayed on the first display section and adjusted in at least magnification and position;

displaying one or more simple observation images simply picked up based on the one or more simple image observation conditions on a second display section;

selecting a desired simple observation image from among the one or more simple observation images displayed on the second display section; and performing an usual image picking-up based on the simple image observation condition corresponding to the selected simple observation image and displaying the picked-up image on the first display section.

25. The electron microscope operation method as claimed in claim 14, further comprising:

setting one or more simple image observation conditions with at least the acceleration voltage or the detector changed as new simple image observation condition for the selected simple observation image, after selecting a desired simple observation image from among the one or more simple observation images displayed on the second display section;

displaying one or more simple observation images simply picked up based on the one or more new simple image observation conditions on the second display section;

selecting a desired simple observation image from among the one or more simple observation images displayed on the second display section; and displaying the selected simple observation image on the first display section.

26. A computer-readable medium including a program executable on a computer for operating an electron microscope which picks up an observation image of a specimen based on an image observation condition, said program comprising instructions having:

a first function of automatically setting a plurality of acceleration voltage conditions with at least an acceleration voltage changed and making a detector selection as different image observation conditions for an observation image picked up under a predetermined image observation condition;

a second function of simply picking up a plurality of observation images in the ascending order of acceleration voltages based on the image observation conditions set through said first function;

a third function of simultaneously displaying on a reduced scale the plurality of simple observation images including at least one secondary electron image and at least one reflection electron image simply picked up through said second function on a second display section;

a fourth function of selecting a desired simple observation image from among the simple observation images displayed on said second display section;

a fifth function of displaying on an enlarged scale the simple observation image selected through said third function on a first display section;

a sixth function of adjusting the observation image displayed on said first display section with respect to at least any of focus, brightness, or contrast;

a seventh function of performing an usual image picking-up based on the image observation condition corresponding to the simple observation image selected and adjusted as required; and a eight function of retaining a desired image observation condition corresponding to the usually picked-up observation image though the seventh function.

* * * * *